US008823406B2

(12) United States Patent
Bolt et al.

(10) Patent No.: US 8,823,406 B2
(45) Date of Patent: Sep. 2, 2014

(54) SYSTEMS AND METHODS FOR SIMULTANEOUS OPTICAL TESTING OF A PLURALITY OF DEVICES UNDER TEST

(75) Inventors: Bryan Bolt, Beaverton, OR (US); Eric W. Strid, Portland, OR (US); Kazuki Negishi, Beaverton, OR (US); Steve Harris, Hillsboro, OR (US)

(73) Assignee: Cascade Micotech, Inc., Beaverton, OR (US)

(*) Notice: Subject to any disclaimer, the term of this patent is extended or adjusted under 35 U.S.C. 154(b) by 240 days.

(21) Appl. No.: 13/275,107

(22) Filed: Oct. 17, 2011

(65) Prior Publication Data

US 2012/0098559 A1  Apr. 26, 2012

Related U.S. Application Data

(60) Provisional application No. 61/394,914, filed on Oct. 20, 2010.

(51) Int. Cl.
| | |
|---|---|
| *G01R 31/20* | (2006.01) |
| *G01J 1/02* | (2006.01) |
| *G01J 1/32* | (2006.01) |
| *G01J 1/04* | (2006.01) |
| *G01J 1/42* | (2006.01) |

(52) U.S. Cl.
CPC ............ *G01J 1/32* (2013.01); *G01J 2001/4247* (2013.01); *G01J 1/0242* (2013.01); *G01J 1/0425* (2013.01); *G01J 2001/0481* (2013.01)
USPC ............. 324/754.03; 324/750.2; 324/756.01; 324/756.06; 324/763.01; 345/571; 250/228; 356/226; 356/73

(58) Field of Classification Search
USPC ............... 324/750.2, 756.01, 756.06, 763; 345/571; 250/228; 356/226, 73
See application file for complete search history.

(56) References Cited

U.S. PATENT DOCUMENTS

| | | |
|---|---|---|
| 5,101,453 A | 3/1992 | Rumbaugh |
| 5,914,613 A | 6/1999 | Gleason et al. |
| 6,071,009 A | 6/2000 | Clyne |
| 6,256,882 B1 | 7/2001 | Gleason et al. |
| 7,190,181 B2 | 3/2007 | Peters et al. |
| 7,368,925 B2 | 5/2008 | Navratil et al. |
| 7,400,317 B2 * | 7/2008 | Moyer .......................... 345/157 |
| 7,862,391 B2 | 1/2011 | Johnston et al. |

(Continued)

OTHER PUBLICATIONS

Modolo et al., "Wafer Level High-Frequency Measurements of Photodetector Characteristics," Applied Optics, vol. 27, No. 15, pp. 3059-3061 (Aug. 1, 1988).

*Primary Examiner* — Patrick Assouad
*Assistant Examiner* — Sean Curtis
(74) *Attorney, Agent, or Firm* — Dascenzo Intellectual Property Law, P.C.

(57) ABSTRACT

Systems and methods for simultaneous optical testing of a plurality of devices under test. These systems and methods may include the use of an optical probe assembly that includes a power supply structure that is configured to provide an electric current to a plurality of devices under test (DUTs) and an optical collection structure that is configured to simultaneously collect electromagnetic radiation that may be produced by the plurality of DUTs and to provide the collected electromagnetic radiation to one or more optical detection devices. The systems and methods also may include the use of the optical probe assembly in an optical probe system to evaluate one or more performance parameters of each of the plurality of DUTs.

27 Claims, 5 Drawing Sheets

(56) References Cited

U.S. PATENT DOCUMENTS

| | | | |
|---|---|---|---|
| 2002/0158656 A1* | 10/2002 | Neeb | 324/771 |
| 2003/0020897 A1 | 1/2003 | Griffiths et al. | |
| 2003/0161163 A1 | 8/2003 | Hussey et al. | |
| 2003/0164707 A1 | 9/2003 | Harrison et al. | |
| 2004/0173732 A1 | 9/2004 | Rogers | |
| 2008/0297771 A1 | 12/2008 | Ou et al. | |
| 2009/0066938 A1* | 3/2009 | Liu et al. | 356/226 |
| 2009/0236506 A1* | 9/2009 | Dudgeon et al. | 250/228 |

* cited by examiner

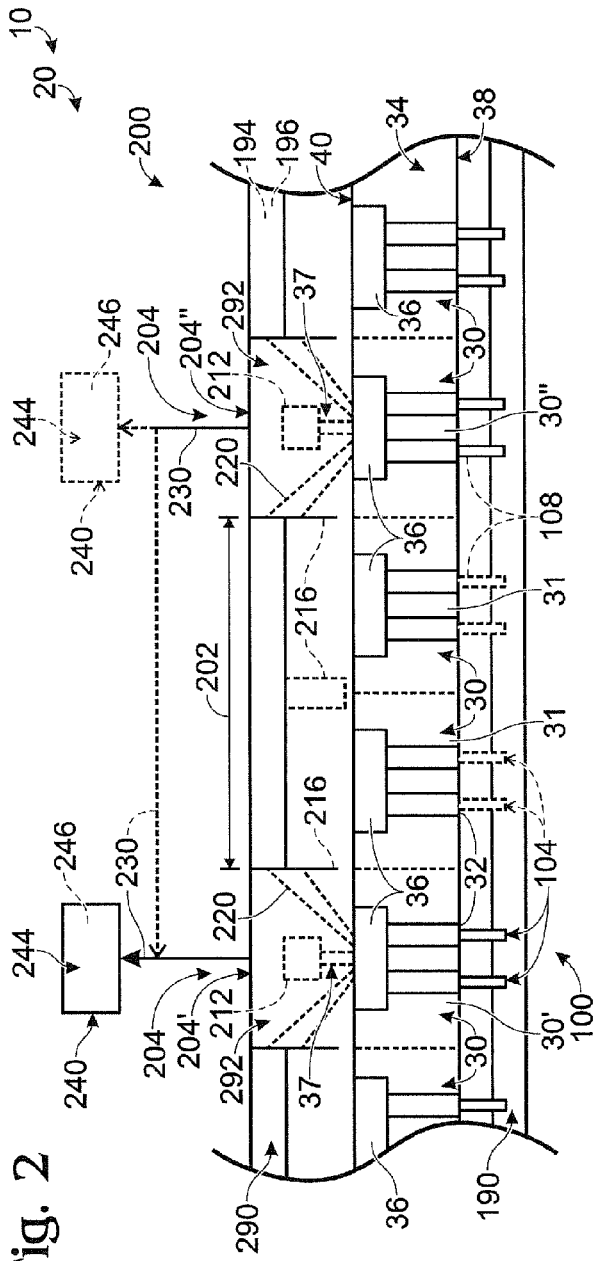
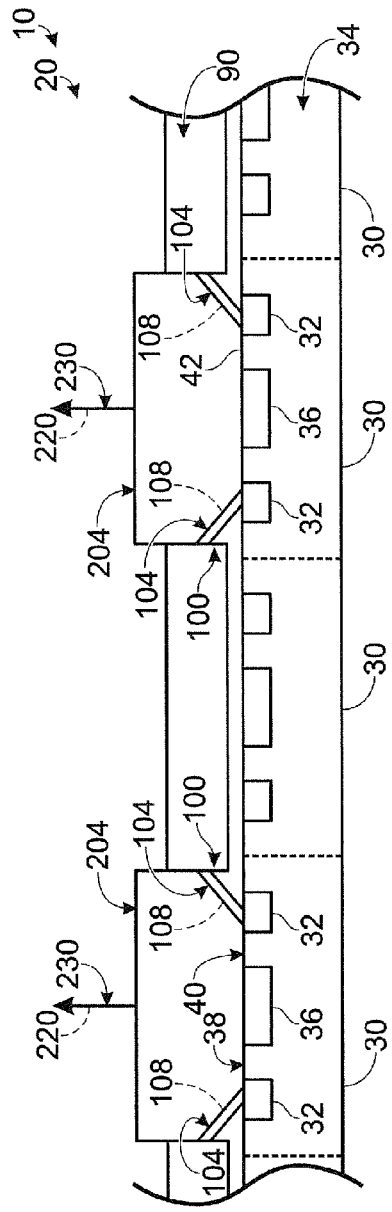
Fig. 2
Fig. 4

SYSTEMS AND METHODS FOR SIMULTANEOUS OPTICAL TESTING OF A PLURALITY OF DEVICES UNDER TEST

RELATED APPLICATION

This application claims priority to U.S. Provisional Patent Application Ser. No. 61/394,914, which was filed on Oct. 20, 2010, and the complete disclosure of which is hereby incorporated by reference.

FIELD OF THE DISCLOSURE

The present disclosure is directed generally to systems and methods for the simultaneous optical testing of a plurality of devices under test, and more specifically to systems and methods for simultaneously testing a plurality of optoelectronic devices.

BACKGROUND OF THE DISCLOSURE

Solid state lighting is a proven, high-efficiency technology that may be utilized as a replacement for more traditional lighting technologies, such as incandescent, fluorescent, halogen, metal halide, neon, and/or high pressure sodium lighting systems. However, the economic viability of solid state lighting is limited due to a variety of factors, including limitations in current manufacturing, characterization, and/or testing processes.

Solid state lighting equipment typically includes multiple optoelectronic devices, such as light-emitting diodes (LEDs), a plurality of which may be manufactured on a single substrate using high volume manufacturing techniques. As an illustrative, non-exclusive example, this may include the use of semiconductor manufacturing techniques to form the plurality of LEDs on a semiconductor wafer, illustrative, non-exclusive examples of which include silicon, gallium arsenide, sapphire, silicon carbide, and/or zinc selenide semiconductor wafers. As another illustrative, non-exclusive example, this may include the use of an alternative substrate, illustrative, non-exclusive examples of which include glass, plastic, and/or polymer substrates and/or wafers.

High volume manufacturing processes, as well as subsequent packaging and/or assembly operations, may utilize test systems to characterize the manufacturing process itself and/or to characterize the products that are produced by the manufacturing process. The speed, or throughput, of these test systems may impact the cost of the final products, the economic viability of the manufacturing process itself, the speed at which improvements to the manufacturing process may be made, and/or the ability of the manufacturer to detect and/or respond to process variations. Thus, there exists a need for improved, high-throughput systems and methods for testing optoelectronic devices.

SUMMARY OF THE DISCLOSURE

Systems and methods for simultaneous optical testing of a plurality of devices under test. These systems and methods may include the use of an optical probe assembly that includes a power supply structure that is configured to provide an electric current to a plurality of devices under test (DUTs) and an optical collection structure that is configured to simultaneously collect electromagnetic radiation that may be produced by the plurality of DUTs and provide the collected electromagnetic radiation to one or more optical detection devices. The systems and methods also may include the use of the optical probe assembly in an optical probe system to evaluate one or more performance parameters of the plurality of DUTs.

In some embodiments, the power supply structure may include a plurality of electrical probes and/or probe tips that may be configured to form an electrical connection with a plurality of electrical contacts associated with the plurality of DUTs and provide the electric current thereto. In some embodiments, the optical collection structure may include one or more optical collection devices that may be configured to collect the electromagnetic radiation. In some embodiments, the one or more optical collection devices includes a lens, an optical conduit, a fiber optic cable, an integrating sphere, a bell, a dome, an optical waveguide, a cone, and/or a mirror. In some embodiments, the one or more optical detection devices may include one or more spectrometers, photodetectors, active pixel sensors, charge-coupled devices, photodiodes, photoresistors, photovoltaic cells, photomultipliers, phototubes, phototransistors, and/or diffraction structures.

In some embodiments, the plurality of DUTs may be present on a substrate. In some embodiments, the power supply structure and the optical collection structure may interface with the same side of the substrate. In some embodiments, the power supply structure and the optical detection structure may interface with opposite sides of the substrate. In some embodiments, the power supply structure may be located between the substrate and the optical collection structure. In some embodiments, the power supply structure may be configured to provide for transmission of the electromagnetic radiation therethrough.

BRIEF DESCRIPTION OF THE DRAWINGS

FIG. 2 is a schematic representation of illustrative, non-exclusive examples of an optical probe assembly according to the present disclosure that is configured to provide electric current to a first side of a plurality of devices under test (DUTs) and collect electromagnetic radiation from a second side of the plurality of DUTs.

FIG. 4 is another schematic representation of illustrative, non-exclusive examples of an optical probe assembly according to the present disclosure that is configured to provide electric current to, and collect electromagnetic radiation from, the same side of the plurality of DUTs.

DETAILED DESCRIPTION AND BEST MODE OF THE DISCLOSURE

Figure 1:
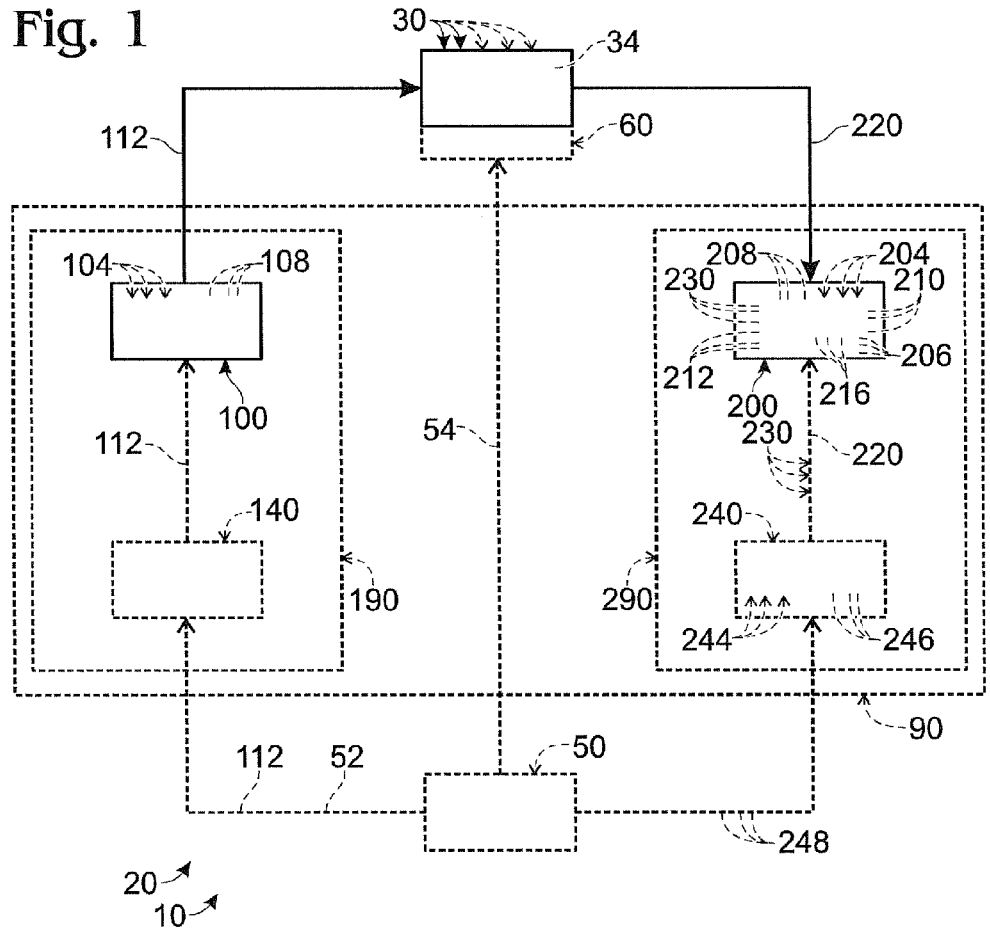
FIG. 1 is a schematic representation of illustrative, non-exclusive examples of an optical probe assembly according to the present disclosure that may form a portion of an optical probe system.

FIG. 1 provides an illustrative, non-exclusive example of an optical probe assembly 20 according to the present disclosure. The optical probe assembly is configured to provide, or simultaneously provide, an electric current 112 to a plurality of devices under test (DUTs) 30 and to receive, or simultaneously receive, electromagnetic radiation 220 from the plurality of DUTs 30. Optical probe assembly 20 includes a power supply structure 100 that is configured to provide the electric current to the plurality of DUTs 30, and an optical collection structure 200 that is configured to receive the electromagnetic radiation from the plurality of DUTs.

The optical probe assembly may form a portion of and/or be in electrical and/or optical communication with an optical probe system 10 that is configured to test, evaluate, and/or quantify the performance, function, and/or operation of the plurality of DUTs. Illustrative, non-exclusive examples of probe systems that may include similar components to optical probe system 10 are disclosed in U.S. Provisional Patent Application Ser. Nos. 61/410,242, 61/446,379, and 61/484,116 and in U.S. Pat. Nos. 5,101,453, 5,914,613, 6,071,009, 6,256,882, 7,190,181, 7,368,925, and 7,862,391, the complete disclosures of which are hereby incorporated by reference.

When the optical probe assembly is in electrical and/or optical communication with optical probe system 10, an analysis system 50 may provide electric current 112 to power supply structure 100 and/or may provide an electric current control signal 52 to an electric current source 140, which may provide the electric current to the power supply structure responsive thereto. Electric current source 140 may form a portion of power supply structure 100 and/or optical probe system 10. Additionally or alternatively, electric current source 140 may form or be a separate and/or independent structure that is configured to provide the electric current to the power supply structure.

In addition, optical collection structure 200 may include and/or be in optical communication with an optical detection structure 240 that is configured to receive electromagnetic radiation 220 from the optical detection structure and to produce one or more data signals 248 therefrom. Data signals 248 may be provided from the optical detection structure to analysis system 50, which may evaluate the performance of the plurality of DUTs based thereon. This may include evaluating and/or calculating an intensity and/or a spectral distribution of the electromagnetic radiation that is produced by each of the plurality of DUTs.

Optical probe system 10 also may include and/or be in electrical and/or mechanical communication with a chuck 60 that is configured to hold, restrain, mechanically isolate, and/or otherwise support the plurality of DUTs 30 within the optical probe system. Chuck 60 may additionally or alternatively be referred to herein as a stage 60. Analysis system 50 may provide a chuck control signal 54 to the chuck, which may control one or more operations of the chuck.

Power supply structure 100 includes any suitable structure that is configured to provide electric current 112 to the plurality of DUTs 30. As an illustrative, non-exclusive example, the power supply structure may include a plurality of electrical probes 104 and/or probe tips 108 that may be configured to provide, create, facilitate, form, and/or produce an electrical conduit, or electrical connection, between the power supply structure and the plurality of DUTs and thus provide for conduction of the electric current between the power supply structure and the plurality of DUTs. As shown in dashed lines in FIG. 1, power supply structure 100 and/or electrical probes 104 and/or probe tips 108 thereof may be located on, operatively attached to, formed on, associated with, and/or form a portion of a power supply probe card 190 that is configured to fix, set, control, and/or otherwise maintain a relative orientation among the components of the power supply structure, such as electrical probes 104 thereof. This may include maintaining the relative orientation to correspond to a relative orientation of the plurality of DUTs and/or a component thereof.

Electric current source 140 may include any suitable structure that is configured to produce, generate, and/or provide electric current 112 to power supply structure 100 and/or to the plurality of DUTs 30. Additionally or alternatively, it is within the scope of the present disclosure that electric current source 140 may include and/or be a voltage source 140 that is configured to provide a bias, a voltage, and/or a potential to power supply structure 100 and/or to the plurality of DUTs 30. Illustrative, non-exclusive examples of electric current sources 140 according to the present disclosure include a DC electric current source that is configured to provide a DC electric current and/or a function generator that is configured to provide a time-varying electric current and/or voltage.

When electric current source 140 includes the DC electric current source, it is within the scope of the present disclosure that optical probe assembly 20 and/or electric current source 140 may be configured to provide the DC electric current to power supply structure 100 and/or to the plurality of DUTs 30 with a forward bias polarity and/or to provide a forward bias voltage to power supply structure 100 and/or to the plurality of DUTs 30. As an illustrative, non-exclusive example, the plurality of DUTs may include a plurality of light emitting diodes (LEDs) that may be configured to produce the electromagnetic radiation when the DC electric current is provided thereto with the forward bias polarity.

Additionally or alternatively, it is also within the scope of the present disclosure that optical probe assembly 20 and/or electric current source 140 may be configured to provide the DC electric current to power supply structure 100 and/or to the plurality of DUTs 30 with a reverse bias polarity and/or to provide a reverse bias voltage to power supply structure 100 and/or to the plurality of DUTs 30. As an illustrative, non-exclusive example, and when the plurality of DUTs includes the plurality of LEDs, the plurality of DUTs may not be configured to produce the electromagnetic radiation when the DC electric current is provided thereto with the reverse bias polarity.

As discussed in more detail herein, electric current source 140 may be separate from, and/or form a part of, power supply structure 100, analysis system 50, and/or optical probe system 10. Similarly, at least a portion of electric current source 140 may be located on, operatively attached to, formed on, associated with, and/or form a portion of power supply probe card 190 and/or may be separate from the power supply probe card.

Optical collection structure 200 may include any suitable structure, such as an optical collection device 204, that is configured to receive, accept, focus, and/or otherwise collect the electromagnetic radiation from the plurality of DUTs and to provide the collected electromagnetic radiation to the optical detection structure. As discussed in more detail herein, illustrative, non-exclusive examples of optical collection structures 200 and/or optical collection devices 204 according to the present disclosure include an integrating sphere 210, a bell, a dome, a fiber optic cable 206, an optical waveguide, a cone, a mirror, and/or a lens 208. It is within the scope of the present disclosure that the optical collection structure may be configured to collect, or simultaneously collect, at least 75%, at least 80%, at least 85%, at least 90%, at least 95%, at least 99%, or at least 99.9% of the electromagnetic radiation that is produced by each of the plurality of DUTs.

As an illustrative, non-exclusive example, optical collection structure 200 may include a single optical collection device 204 that is configured to collect the electromagnetic radiation from each of the plurality of DUTs. As another illustrative, non-exclusive example, optical collection structure 200 may include a plurality of optical collection devices 204, each of which is configured to receive the electromagnetic radiation from a portion of the plurality of DUTs.

When the optical collection structure includes the plurality of optical collection devices 204, it is within the scope of the present disclosure that each of the plurality of optical collection devices is respectively configured to collect the electromagnetic radiation from only one of the plurality of DUTs. However, it is also within the scope of the present disclosure that each of the plurality of optical collection devices is configured to simultaneously collect the electromagnetic radiation from at least 2, at least 3, at least 4, at least 5, at least 10, at least 25, at least 50, at least 100, at least 250, at least 500, at least 1000, at least 2500, at least 5000, at least 10,000, 1-100, 1-1,000, 2-5, 5-25, at least 1%, at least 2%, at least 3%, at least 4%, at least 5%, at least 7.5%, or at least 10% of the plurality of DUTs.

The plurality of optical collection devices may include any suitable number of optical collection devices. As illustrative, non-exclusive examples, the plurality of optical collection devices may include at least 2, at least 3, at least 4, at least 5, at least 6, at least 7, at least 8, at least 9, at least 10, at least 15, at least 20, at least 25, at least 30, at least 40, at least 50, at least 75, or at least 100 optical collection devices.

Optical collection structure 200 and/or optical collection device(s) 204 thereof may be located on, operatively attached to, formed on, associated with, and/or form a portion of an optical probe card 290, as schematically indicated in dashed lines in FIG. 1. Similar to power supply probe card 190, optical probe card 290 may be configured to fix, set, control, and/or otherwise maintain a relative orientation among the components of the optical collection structure, such as optical collection devices 204 thereof. This may include maintaining the relative orientation to correspond to a relative orientation of the plurality of DUTs and/or a component thereof.

When optical collection device(s) 204 are operatively attached to optical probe card 290, it is within the scope of the present disclosure that the optical collection device(s) may be configured to be detached, or otherwise removed, from the optical probe card. This may include removing the optical collection device(s) from the optical probe card without damage to the optical collection device(s) and/or the optical probe card. As an illustrative, non-exclusive example, the optical collection device(s) may be configured to be removed from the optical probe card to repair and/or replace one or more of the optical collection devices and/or the optical probe card.

It is within the scope of the present disclosure that each of the plurality of DUTs 30 may emit the electromagnetic radiation at a plurality of angles, or orientations, with respect to a surface, or surface normal, of the plurality of DUTs. In addition, each of the plurality of DUTs may include an angular distribution of the electromagnetic radiation that is produced therefrom, such as when the intensity and/or wavelength of the electromagnetic radiation that is produced at a first angle may differ from an intensity and/or wavelength of the electromagnetic radiation that is produced at a second angle that is different from the first angle. This angular distribution may include a peak intensity region that includes a higher intensity of the electromagnetic radiation than one or more other regions of the angular distribution.

The intensity of the electromagnetic radiation within the peak intensity region, when provided to the optical detection structure, may be sufficient to saturate the optical detection structure and/or decrease the potential for the optical detection structure to detect, and/or for optical probe system 10 to evaluate, the optical characteristics of the electromagnetic radiation that is not within the peak intensity region. Thus, it is within the scope of the present disclosure that optical collection structure 200 also may include and/or be in optical communication with one or more attenuating structures 212 that are configured to decrease, or decrease a proportion of, the electromagnetic radiation from and/or in the peak intensity region that reaches the optical detection structure.

Illustrative, non-exclusive examples of attenuating structures 212 according to the present disclosure include any suitable absorbing structure that is configured to absorb the electromagnetic radiation in the peak intensity region and/or any suitable reflecting structure that is configured to reflect the electromagnetic radiation in the peak intensity region away from the optical detection structure and/or away from an optical conduit 230 that may be utilized to provide the electromagnetic radiation from the optical collection structure to the optical detection structure. As illustrative, non-exclusive examples, the attenuating structure may be configured to decrease the intensity of the electromagnetic radiation in the peak intensity region that reaches the optical detection structure by at least 50%, at least 60%, at least 70%, at least 80%, at least 90%, at least 95%, at least 99%, at least 99.9%, or 100%.

When optical collection structure 200 includes a plurality of optical collection devices 204, the optical collection structure, at least a portion of the optical collection devices, and/or optical probe card 290 may include, be operatively attached to, be associated with, and/or be in optical communication with one or more optical baffle structures 216 that are configured to decrease an undesired transmission and/or collection of electromagnetic radiation. As an illustrative, non-exclusive example, optical baffle structures 216 may be configured to decrease a transmission of electromagnetic radiation from a first device under test (DUT) of the plurality of DUTs that is associated with a first optical collection device to a second optical collection device that is associated with a second DUT of the plurality of DUTs. In this way, crosstalk, noise, and/or signal contamination among the plurality of DUTs may be decreased.

As discussed in more detail herein, optical collection structure 200 and/or optical collection device 204 may include, be, and/or be in optical communication with, one or more optical conduits 230 that may be configured to convey, or transmit, the electromagnetic radiation from a portion of the plurality of DUTs to the optical detection structure and/or from the optical collection structure to the optical detection structure. Illustrative, non-exclusive examples of optical conduits according to the present disclosure include any suitable fiber optic cable, lens, mirror, optical filter, diffraction structure, diffraction grating, and/or prism. Illustrative, non-exclusive examples of the portion of the plurality of DUTs include at least 1, at least 2, at least 3, at least 4, at least 5, at least 10, at least 25, at least 50, at least 100, at least 250, at least 500, at least 1,000, at least 2,500, at least 5,000, at least 10,000, at least 1%, at least 2%, at least 3%, at least 4%, at least 5%, at least 7.5%, at least 10%, at least 15%, at least 20%, at least 25%, at least 50%, at least 75%, 100%, 1-10%, 1-25%, 5-20%, or 5-50% of the plurality of DUTs.

The optical collection structure may include any suitable number of optical conduits. As illustrative, non-exclusive examples, the optical collection structure may include at least 2, at least 3, at least 4, at least 5, at least 10, or at least 25 optical conduits. As another illustrative, non-exclusive example, the optical collection structure may include one optical conduit for each of the plurality of DUTs. As yet another illustrative, non-exclusive example, and when the optical collection structure includes a plurality of optical collection devices, each of the plurality of optical collection devices may be in optical communication with a selected, or respective, optical conduit that is configured to transmit the electromagnetic radiation from the optical collection device to the optical detection structure.

Optical detection structure 240 may include any suitable structure that is configured to receive the electromagnetic radiation from optical collection structure 200 and/or the plurality of DUTs 30 and to produce data signal 248 therefrom. As an illustrative, non-exclusive example, the optical detection structure may include and/or be an optical transducer 244. Illustrative, non-exclusive examples of optical transducers according to the present disclosure include any suitable spectrometer 246, photodetector, active pixel sensor, charge-coupled device, photodiode, photoresistor, photovoltaic cell, photomultiplier, phototube, phototransistor, and/or diffraction structure that is configured to provide the electromagnetic radiation to a linear array spectrometer.

It is within the scope of the present disclosure that optical detection structure 240 may include a plurality of optical transducers 244 and that the plurality of optical transducers may be configured to produce a plurality of data signals 248. Each of the plurality of data signals may include information regarding one or more optical characteristics of a portion of the plurality of DUTs. Illustrative, non-exclusive examples of the portion of the plurality of DUTs include 1, at least 2, at least 3, at least 4, at least 5, at least 10, at least 25, at least 50, at least 100, at least 250, at least 500, at least 1000, at least 2500, at least 5000, at least 10,000 at least 1%, at least 2%, at least 3%, at least 4%, at least 5%, at least 7.5%, at least 10%, at least 15%, at least 20%, at least 25%, at least 50%, 1-10%, 1-25%, 5-20%, or 5-50% of the plurality of DUTs.

Data signal 248, which also may be referred to herein as optical transducer electric output 248, may include information regarding any suitable optical characteristic of each of the plurality of DUTs. Illustrative, non-exclusive examples of optical characteristics include an intensity and/or a spectral distribution of the electromagnetic radiation produced by each of the plurality of DUTs.

When optical collection structure 200 includes optical probe card 290, optical detection structure 240 may be present on, and/or operatively attached to, the optical probe card. Alternatively, the optical detection structure may be separate and/or independent from the optical probe card.

With continued reference to FIG. 1, it is also within the scope of the present disclosure that power supply structure 100, electric current source 140, optical collection structure 200, and/or optical detection structure 240 may be located on, operatively attached to, formed on, associated with, and/or form a portion of a combined probe card 90. Combined probe card 90, which also may be referred to herein as a probe card 90, may be configured to fix, set, control, and/or otherwise maintain a relative orientation among the power supply structure, the electric current source, the optical collection structure, the optical detection structure, and/or components thereof.

DUTs 30 may include any suitable device that may be configured to receive the electric current from the optical probe assembly and/or from the power supply structure thereof and to produce the electromagnetic radiation therefrom. Illustrative, non-exclusive examples of DUTs 30 according to the present disclosure include optoelectronic devices and/or LEDs.

The plurality of DUTs 30 may be on, or formed on, a substrate 34, which also may be referred to herein as planar substrate 34 and/or substantially planar substrate 34. Illustrative, non-exclusive examples of substrate 34 according to the present disclosure include any suitable semiconductor wafer, silicon substrate, gallium arsenide substrate, sapphire substrate, silicon carbide substrate, zinc selenide substrate, glass substrate, plastic substrate, and/or polymer substrate.

It is within the scope of the present disclosure that substrate 34 may include any suitable number of DUTs 30, including at least 1,000, at least 5,000, at least 10,000, at least 20,000, at least 30,000, at least 40,000, at least 50,000, at least 60,000, at least 70,000, at least 80,000, at least 90,000, or at least 100,000 DUTs. In addition, it is also within the scope of the present disclosure that the plurality of DUTs that may be tested, or simultaneously tested, by optical probe assembly 20 and/or optical probe system 10 at a given time may include any suitable portion, proportion, fraction, and/or percentage of the total number of DUTs that may be present on substrate 34. As an illustrative, non-exclusive example, the portion of the plurality of DUTs may include all of the DUTs that may be present on substrate 34. As another illustrative, non-exclusive example, the portion of the plurality of DUTs may include at least 1%, at least 2%, at least 3%, at least 4%, at least 5%, at least 10%, at least 15%, at least 20%, at least 25%, at least 50%, 1-10%, 5-20%, or 1-25% of the DUTs that may be present on substrate 34.

When DUTs 30 are present on substrate 34, it is within the scope of the present disclosure that the DUTs may be arranged in any suitable manner. As an illustrative, non-exclusive example, the substrate may include a two-dimensional grid, or array, of DUTs 30. When the substrate includes a two-dimensional grid of DUTs 30, it is within the scope of the present disclosure that a first DUT of the plurality of DUTs may be spaced apart from a second DUT of the plurality of DUTs by any suitable amount in one and/or both dimensions.

As an illustrative, non-exclusive example, the first DUT of the plurality of DUTs may be spaced apart from the second DUT of the plurality of DUTs by 1, at least 1, at least 2, at least 3, at least 4, at least 5, at least 10, at least 15, at least 20, at least 25, at least 50, at least 75, or at least 100 intermediate DUTs that are not included in the plurality of DUTs in one and/or both dimensions. Accordingly, the first and second DUTs may be described as being spaced apart from each other by at least the corresponding dimension of the intermediate DUTs, and any spacing between adjacent DUTs. As another illustrative, non-exclusive example, the first DUT of the plurality of DUTs may be spaced apart from the second DUT of the plurality of DUTs by at least a threshold separation distance, illustrative, non-exclusive examples of which include threshold separation distances of at least 1 mm, at least 2 mm, at least 3 mm, at least 4 mm, at least 5 mm, at least 10 mm, at least 15 mm, at least 20 mm, at least 25 mm, at least 30 mm, at least 35 mm, at least 40 mm, at least 45 mm, or at least 50 mm in one and/or both dimensions and the plurality of DUTs may not include an intermediate DUT between the first DUT of the plurality of DUTs and the second DUT of the plurality of DUTs.

Electromagnetic radiation 220 may include any suitable form of electromagnetic radiation. As illustrative, non-exclusive examples, the electromagnetic radiation may include infrared, visible, and/or ultraviolet electromagnetic radiation. As another illustrative, non-exclusive example, a wavelength of the electromagnetic radiation may be in the range of $10^{-10}$ and $10^{-2}$ meters (m), in the range of $10^{-8}$ and $10^{-7}$ meters, in the range of $10^{-7}$ and $10^{-6}$ meters, in the range of $10^{-6}$ and $10^{-3}$ meters, and/or in the range of 380-750 nanometers.

FIGS. 2-9 provide less schematic but still illustrative, non-exclusive examples of optical probe systems 10, optical probe assemblies 20, and/or portions thereof according to the present disclosure. The optical probe systems, optical probe assemblies, and/or portions thereof that are illustrated in FIGS. 2-9 may be similar to and/or include similar components to those of FIG. 1. Like components are labeled with like numbers and may not be discussed in detail herein with reference to each individual Figure. Similarly, variants, features, and/or subcomponents or characteristics of the components described in FIG. 1 also may apply to like components of FIGS. 2-9.

FIG. 2 is a schematic representation of illustrative, non-exclusive examples of an optical probe assembly 20 according to the present disclosure that is configured to provide electric current to a first side of a plurality of DUTs and to collect electromagnetic radiation from a second side of the plurality of DUTs. The optical probe assembly of FIG. 2 includes power supply probe card 190 and optical probe card 290, which are separated from each other. Power supply probe card 190 is operatively attached to power supply structure 100, which may include a plurality of electrical probes 104 and/or probe tips 108. Optical probe card 290 is operatively attached to optical collection structure 200, which may include a plurality of optical collection devices 204.

FIG. 2 also illustrates that DUTs 30 may be present on substrate 34 and may include one or more pads 32, which also may be referred to herein as electrical contacts 32, that may be configured to interface and/or form an electrical connection with power supply structure 100. In addition, DUTs 30 also may include one or more emitters 36, which may be configured to emit electromagnetic radiation 220 therefrom responsive to receipt of the electric current.

Power supply probe card 190 may be proximal to, located normal to, and/or in electrical communication with a power contact side 38 of substrate 34. Power contact side 38 may include pads 32 such that power supply structure 100 may form an electrical connection therewith. Similarly, optical probe card 290 may be proximal to, located normal to, and/or in optical communication with an emission side 40 of substrate 34. Emission side 40 may include emitter 36 such that optical collection structure 200 may receive electromagnetic radiation 220 therefrom.

In the illustrative, non-exclusive example of FIG. 2, power contact side 38 and emission side 40 of substrate 34 are substantially opposed and/or opposite sides of substrate 34. Thus, power supply structure 100 and optical collection structure 200, and/or the power supply probe card 190 and optical probe card 290 thereof, are located on opposite sides of the substrate. However, and as discussed in more detail herein, it is also within the scope of the present disclosure that power contact side 38 and emission side 40 may be, be located on, and/or include, a single and/or the same side of substrate 34. When power contact side 38 and emission side 40 are the same side of substrate 34, power supply structure 100 and optical collection structure 200, and/or power supply probe card 190 and optical probe card 290 thereof may be located on the same side of substrate 34, which also may be referred to herein as a test side of substrate 34.

FIG. 2 further illustrates that optical probe card 290 may include one or more recesses 292, which also may be referred to herein as holes 292, openings 292, passages 292, and/or optical passages 292. Recesses 292 may be configured to hold, receive, and/or otherwise locate optical collection structure 200, and/or optical collection devices 204 thereof, on the optical probe card. Recesses 292 may provide for the transmission of electromagnetic radiation 220 from DUTs 30 to optical collection device 204 and/or from DUTs 30 to optical detection structure 240. Additionally or alternatively, it is also within the scope of the present disclosure that optical probe card 290 may include and/or be an optically transparent optical probe card 194 and/or may include optically transparent regions 196. When optical probe card 290 includes the optically transparent optical probe card and/or includes optically transparent regions, electromagnetic radiation 220 may be transmitted from DUTs 30 to optical collection device 204 and/or optical detection structure 240 without the need for and/or use of recesses 292.

FIG. 2 also illustrates that, as discussed in more detail herein, optical collection structure 200 may include at least one attenuating structure 212. Attenuating structure 212 may attenuate, block, and/or decrease a proportion of the electromagnetic radiation produced by DUTs 30 that reaches optical detection structure 240, such as by blocking at least a portion of the electromagnetic radiation within peak intensity region 37 of DUTs 30.

As discussed in more detail herein and shown in more detail in FIG. 2, it is within the scope of the present disclosure that each DUT 30 of the plurality of DUTs that is being tested by optical probe assembly 20 at a given time may be associated with a respective optical collection device 204. In the illustrative, non-exclusive example of FIG. 2, DUT 30' may be associated with optical collection device 204', and DUT 30'' may be associated with optical collection device 204''. As also discussed in more detail herein, one or more optical baffle structures 216 may be configured to block, decrease, and/or otherwise attenuate the electromagnetic radiation that is produced by a first DUT, such as DUT 30', from reaching an optical collection structure and/or an optical collection device thereof, such as optical collection device 204'', that is associated with a second DUT, such as DUT 30''.

Optical probe assembly 20 may be configured to provide the electric current to and simultaneously collect electromagnetic radiation 220 from a plurality of DUTs 30, two of which are illustrated in FIG. 2. As shown in FIG. 2, the plurality of DUTs may not include every DUT that is present on substrate 34. Thus, first DUT 30' may be separated from second DUT 30'' by one or more intermediate DUTs 31, two of which are shown in FIG. 2. Illustrative, non-exclusive examples of the number of intermediate DUTs 31 that may separate first DUT 30' from second DUT 30'' are discussed in more detail herein. Additionally or alternatively, and as also discussed in more detail herein, first DUT 30' may be separated, or spaced apart, from second DUT 30" by at least a threshold separation distance 202, illustrative, non-exclusive examples of which are discussed in more detail herein.

FIG. 2 further illustrates that power supply structure 100 is configured to form an electrical connection with DUTs 30 that are included in the plurality of DUTs 30 and tested at a given time. However, and as shown in dashed lines in FIG. 2, power supply structure 100 also may be configured to form an electrical connection with one or more intermediate DUTs 31. When the power supply structure is configured to form an electrical connection with one or more intermediate DUTs 31, it is within the scope of the present disclosure that, when optical probe assembly 20 is transitioned from optically testing a first plurality of DUTs to optically testing a second plurality of DUTs that does not include the DUTs present within the first plurality of DUTs, a relative orientation of the optical collection structure with respect to substrate 34 may be changed from a relative orientation in which the location of the optical collection structure corresponds to the location of the first plurality of DUTs to an orientation in which the location of the optical collection structure corresponds to the location of the second plurality of DUTs without changing a relative orientation of the power supply structure with respect to the substrate and/or DUTs 30 thereof.

In addition, and as also discussed in more detail herein, FIG. 2 further illustrates that optical collection structure 200 may provide the collected electromagnetic radiation via one or more optical conduits 230 to one or more optical detection structures 240, such as optical transducer 244 and/or spectrometer 246. This may include providing the electromagnetic radiation from a portion and/or all of the plurality of DUTs to a single optical detection structure 240 and/or providing the electromagnetic radiation from each of the plurality of DUTs to an associated, complementary, designated, and/or respective optical detection structure 240.

Figure 3:
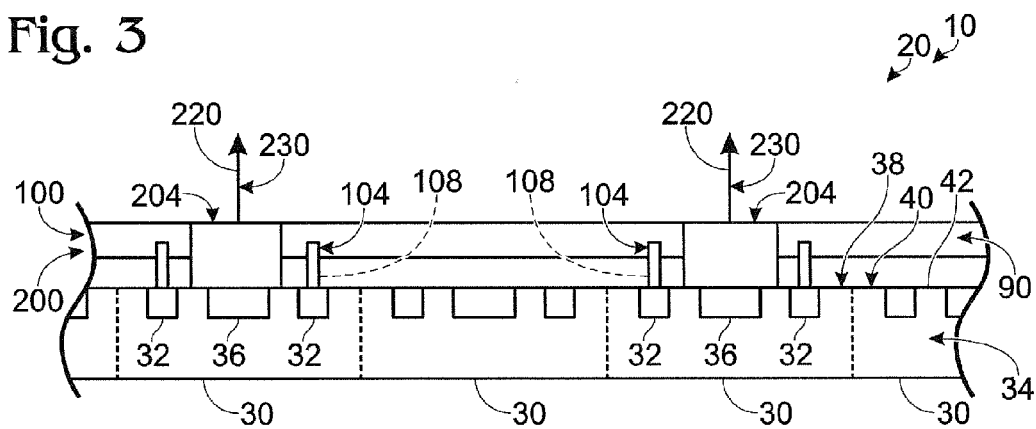
FIG. 3 is a schematic representation of illustrative, non-exclusive examples of an optical probe assembly according to the present disclosure that is configured to provide electric current to, and collect electromagnetic radiation from, the same side of the plurality of DUTs.
Figure 5:
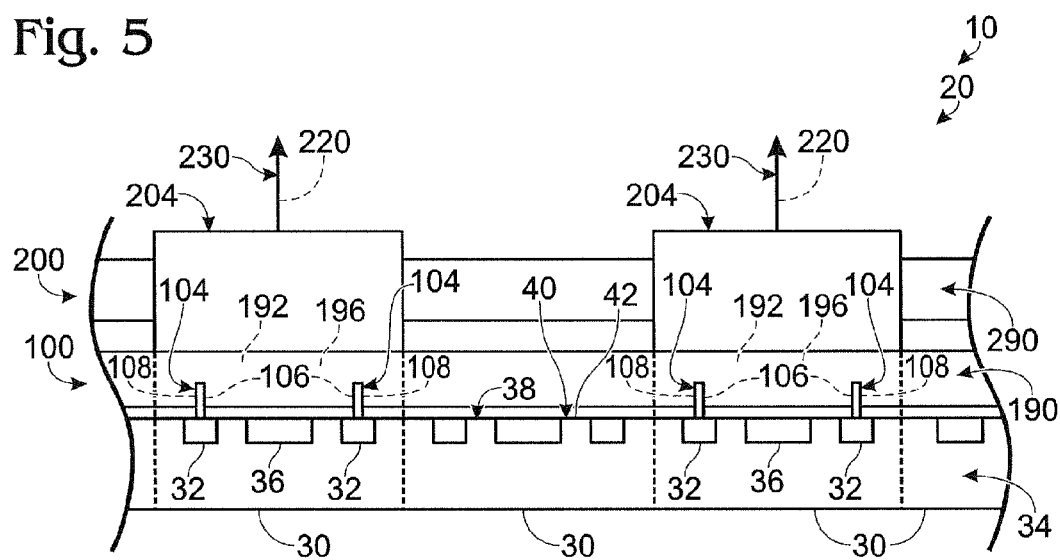
FIG. 5 is another schematic representation of illustrative, non-exclusive examples of an optical probe assembly according to the present disclosure that is configured to provide electric current to, and collect electromagnetic radiation from, the same side of the plurality of DUTs.

FIGS. 3-5 provide additional illustrative, non-exclusive examples of optical probe assemblies 20 according to the present disclosure. In the illustrative, non-exclusive examples of FIGS. 3-5, power contact side 38 and emission side 40 of substrate 34 are present on the same side of the substrate, which also may be referred to herein as test side 42 of the substrate.

FIG. 3 is a schematic representation of illustrative, non-exclusive examples of an optical probe assembly 20 according to the present disclosure that is configured to provide electric current to, and collect electromagnetic radiation from, test side 42 of substrate 34. Optical probe assembly 20 of FIG. 3 includes power supply structure 100 and optical collection structure 200 operatively attached to a probe card 90. Probe card 90 may include and/or be both power supply probe card 190 and optical probe card 290. Probe card 90 may be substantially similar to optical probe card 290 of FIG. 2 but also may include and/or be operatively attached to power supply structure 100, which may include the plurality of electrical probes 104 and/or probe tips 108 thereof.

FIG. 4 is another schematic representation of illustrative, non-exclusive examples of an optical probe assembly 20 according to the present disclosure that is configured to provide electric current to, and collect electromagnetic radiation from, test side 42 of substrate 34. Optical probe assembly 20 of FIG. 4 includes a power supply structure that is operatively attached to the optical collection structure, with the optical collection structure being operatively attached to probe card 90. Probe card 90 may be substantially similar to optical probe card 290 of FIG. 2. However, optical collection structures 200 of FIG. 4 may include and/or be operatively attached to power supply structure 100, such as to electrical probes 104 and/or probe tips 108 thereof.

FIG. 5 is another schematic representation of illustrative, non-exclusive examples of an optical probe assembly 20 according to the present disclosure that is configured to provide electric current to, and collect electromagnetic radiation from, test side 42 of substrate 34. Optical probe assembly 20 of FIG. 5 includes separate power supply probe card 190 and optical probe card 290. In FIG. 5, power supply probe card 190 may be located between substrate 34, and/or DUTs 30 thereof, and optical probe card 290. The optical probe card of FIG. 5 may be substantially similar to optical probe card 290 of FIG. 2.

Power supply probe card 190 of FIG. 5 also may be substantially similar to power supply probe card 190 of FIG. 2; however, the power supply probe card of FIG. 5 may be configured for transmission of the electromagnetic radiation therethrough. As an illustrative, non-exclusive example, power supply probe card 190 may include a plurality of recesses 192, which also may be referred to herein as holes 192, openings 192, passages 192, and/or optical passages 192, and which may be configured to provide for transmission of the electromagnetic radiation from the plurality of DUTs and to optical collection structure 200.

As another illustrative, non-exclusive example, the power supply probe card may include an optically transparent power supply probe card 194 and/or may include one or more optically transparent regions 196 that are configured to provide for transmission of the electromagnetic radiation therethrough. The optically transparent power supply probe card and/or the optically transparent regions may be constructed of any suitable material, illustrative, non-exclusive examples of which include any suitable glass, quartz, and/or polymeric material.

As yet another illustrative, non-exclusive example, the plurality of electrical probes 104 associated with power supply structure 100 and/or power supply probe card 190 may include optically transparent electrical probes 106 that may be configured to provide for transmission of the electromagnetic radiation therethrough. The optically transparent electrical probes may be constructed of any suitable optically transparent electrical conductor, illustrative, non-exclusive examples of which include graphene and/or indium tin oxide.

Figure 6:
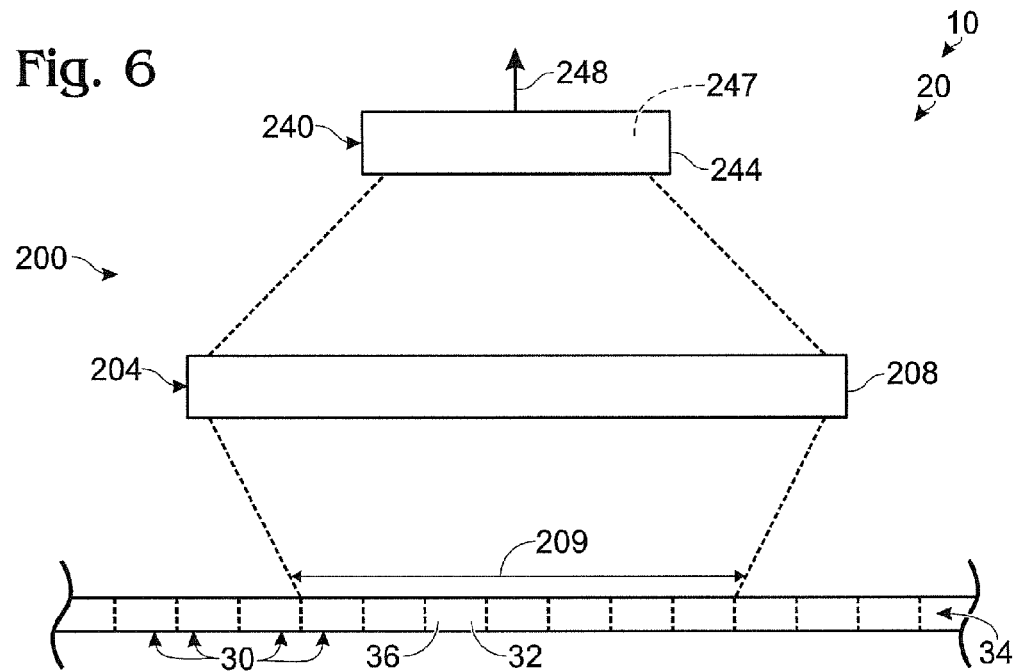
FIG. 6 is a schematic representation of an illustrative, non-exclusive example of an optical probe assembly according to the present disclosure that includes a lens that is configured to collect the electromagnetic radiation from the plurality of DUTs and to provide the electromagnetic radiation to an optical detection structure.

FIG. 6 is a schematic representation of an illustrative, non-exclusive example of an optical probe assembly 20 according to the present disclosure that includes an optical collection structure 200 in the form of a lens 208 that is configured to collect the electromagnetic radiation from the plurality of DUTs and to provide the collected electromagnetic radiation to optical detection structure 240. As shown in dashed lines in FIG. 6, lens 208 may be configured to collect electromagnetic radiation that is emitted from a plurality of DUTs 30 within an imaging region 209 of substrate 34 and to focus the collected electromagnetic radiation on optical detection structure 240.

It is within the scope of the present disclosure that imaging region 209 may include all of substrate 34. When imaging region 209 includes all of substrate 34, optical collection structure 200 may be configured to collect the electromagnetic radiation from each of the plurality of DUTs without changing the relative orientation of lens 208 with respect to substrate 34.

However, it is also within the scope of the present disclosure that imaging region 209 may include a portion of substrate 34. When imaging region 209 includes the portion of substrate 34, optical probe assembly 20 may be configured to change a relative orientation of optical collection structure 200 and/or lens 208 with respect to substrate 34 to sequentially collect the electromagnetic radiation from a plurality of portions of substrate 34 in order to evaluate the performance of each, or at least a desired portion, of the DUTs present on substrate 34.

It is within the scope of the present disclosure that optical probe assembly 20 may provide the electric current to, and simultaneously collect the electromagnetic radiation from, the plurality of DUTs that are present within imaging region 209. As an illustrative, non-exclusive example, this may include providing the electric current to, and simultaneously collecting the electromagnetic radiation from, all of the DUTS that are within imaging region 209 and/or all of the functional DUTs that are present within imaging region 209.

As another illustrative, non-exclusive example, this may include providing the electric current to, and simultaneously collecting the electromagnetic radiation from, a first plurality of DUTs that is present within imaging region 209 and subsequently providing the electric current to, and simultaneously collecting the electromagnetic radiation from, a second plurality of DUTs that is present within imaging region 209, wherein the first plurality of DUTs may be different from the second plurality of DUTs.

Optical detection structure 240 may include any suitable optical transducer 244 that is configured to collect the electromagnetic radiation and to produce data signal 248 therefrom. As an illustrative, non-exclusive example, optical transducers 244 may include a spectrometer, a 2-dimensional optical sensor array 247 and/or a CCD camera. Additional illustrative, non-exclusive examples of optical transducers 244 are discussed in more detail herein.

Figure 7:
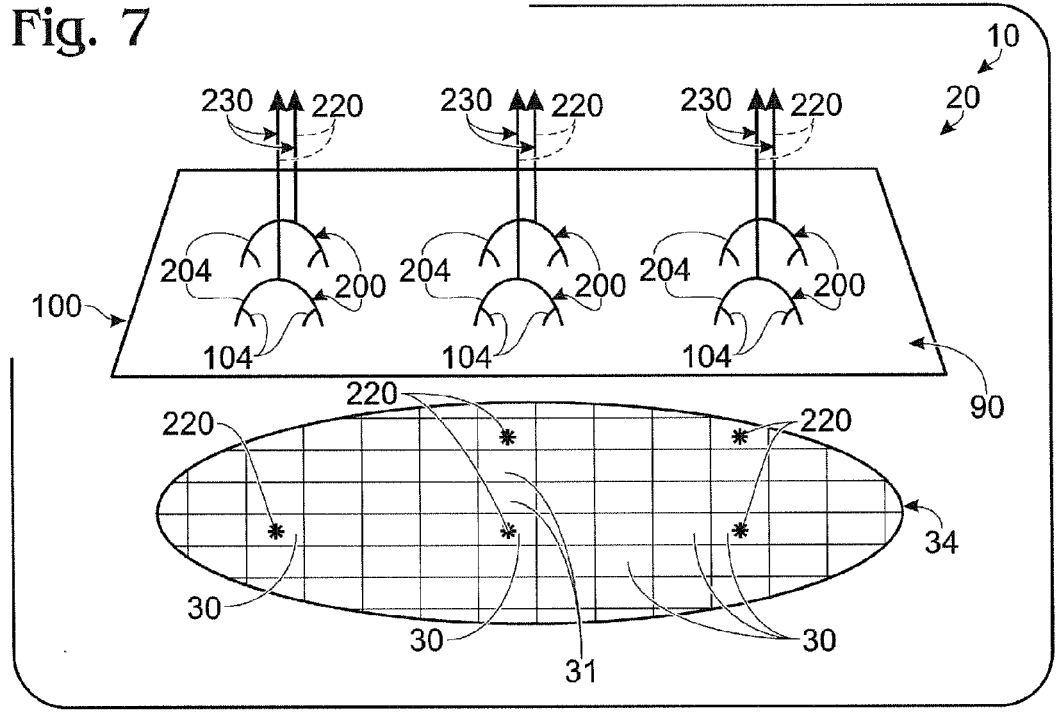
FIG. 7 is a less schematic but still illustrative, non-exclusive example of an optical probe assembly according to the present disclosure that is configured to provide electric current to, and collect electromagnetic radiation from, a plurality of DUTs that are arranged in a two-dimensional array on a substrate.

FIG. 7 is a less schematic but still illustrative, non-exclusive example of an optical probe assembly 20 according to the present disclosure that is configured to provide electric current to, and collect electromagnetic radiation from, a plurality of DUTs that are arranged in a two-dimensional array on a substrate 34. The optical probe assembly of FIG. 7 includes a probe card 90 that includes power supply structure 100 in the form of a plurality of electrical probes 104 and optical collection structure 200 in the form of a plurality of bell-shaped optical collection devices 204.

For a given configuration and/or orientation of optical probe assembly 20 with respect to substrate 34, electrical probes 104 may be arranged, located, configured, and/or spaced to provide electric current to a plurality of DUTs 30 that are present on substrate 34. In FIG. 7, the plurality of DUTs that receive the electric current for the illustrated orientation are shown emitting electromagnetic radiation 220. Similarly, optical collection devices 204 may be arranged, located, configured, and/or spaced to collect the emitted electromagnetic radiation from the plurality of DUTs.

As shown in FIG. 7 and discussed in more detail herein, the plurality of DUTs may include a sub-portion of the total number of DUTs that may be present on substrate 34. As such, in the given orientation of optical probe assembly 20 with respect to substrate 34, one or more intermediate DUTs 31 (two of which are labeled in FIG. 7 but all of which are shown not emitting electromagnetic radiation 220) may separate the DUTs that comprise and/or are included in the plurality of DUTs. Thus, the orientation, or relative orientation, of optical probe assembly 20 with respect to substrate 34 may be changed one or more times while testing DUTs 30 that are present on substrate 34 in order to provide for testing all, or at least a desired portion, of the DUTs that are present on substrate 34.

Figure 8:
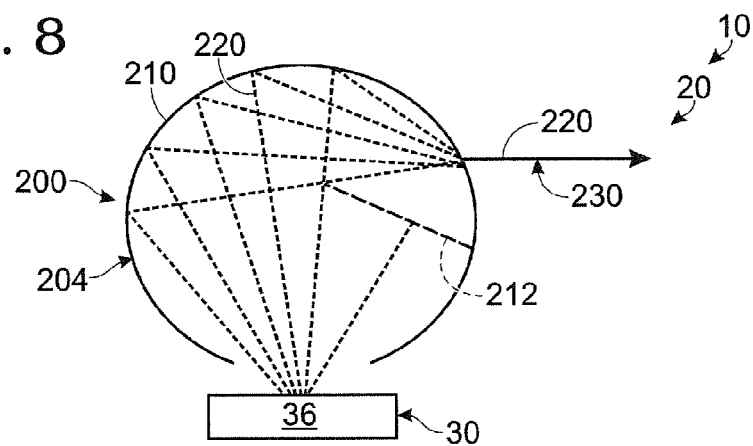
FIG. 8 is an illustrative, non-exclusive example of an optical collection device according to the present disclosure.

FIG. 8 is an illustrative, non-exclusive example of an optical collection device 204 according to the present disclosure that includes an integrating sphere 210. As shown in dotted lines in FIG. 8, integrating sphere 210 may be configured to collect electromagnetic radiation 220 that is emitted by DUT 30 and to reflect, focus, and/or otherwise direct the collected electromagnetic radiation to and/or toward optical conduit 230, which may provide the collected electromagnetic radiation to the optical detection structure.

The integrating sphere may include attenuating structure 212 that may be configured to block, attenuate, and/or otherwise decrease a magnitude of the electromagnetic radiation that is provided to optical conduit 230. As discussed in more detail herein, this may include attenuating the electromagnetic radiation that is within the peak intensity region of DUT 30.

Figure 9:
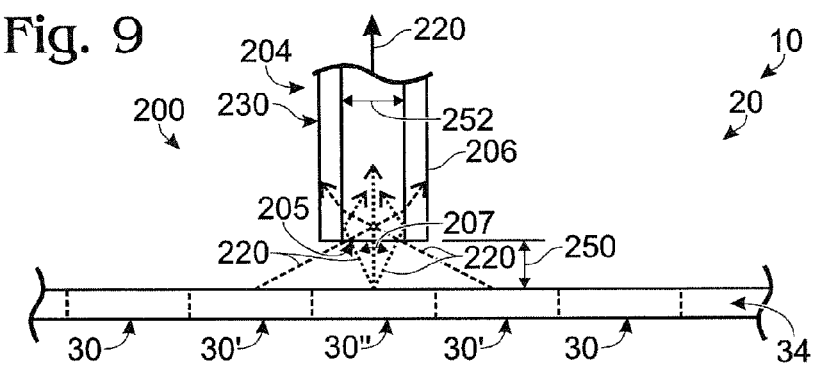
FIG. 9 is another illustrative, non-exclusive example of an optical collection device according to the present disclosure.

FIG. 9 is another illustrative, non-exclusive example of an optical collection device 204 according to the present disclosure that includes a fiber optic cable 206. Fiber optic cable 206 may include an acceptance cone 207, which also may be referred to herein as an acceptance angle 207. As shown in dotted lines in FIG. 9, electromagnetic radiation that is provided to an end 205 of the fiber optic cable and is within acceptance cone 207 may be transmitted, or propagated, along a length of the fiber optic cable. Conversely, and as shown in dashed lines in FIG. 9, electromagnetic radiation that is provided to end 205 of the fiber optic cable but is not within acceptance cone 207 may not be transmitted, or propagated, along the length of the fiber optic cable. Thus, control of a distance 250 between DUT 30 and end 205, a diameter 252 of the fiber optic cable, the materials that comprise the fiber optic cable, and/or an orientation of the fiber optic cable with respect to DUT 30 may be utilized to control and/or decrease a magnitude of the electromagnetic radiation that is emitted by a neighboring DUT, such as DUTs 30' in FIG. 9, that may be collected by a fiber optic cable that is associated with a selected DUT, such as DUT 30" in FIG. 9.

Figure 10:
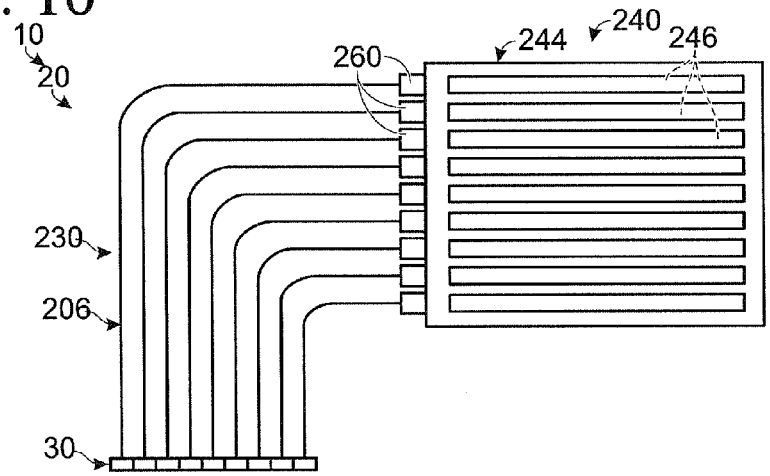
FIG. 10 is an illustrative, non-exclusive example of an optical detection device according to the present disclosure.

FIG. 10 is an illustrative, non-exclusive example of an optical detection structure 240 according to the present disclosure in the form of a plurality of optical transducers 244. In FIG. 10, a plurality of optical conduits 230, such as a plurality of fiber optic cables 206, may be configured to provide electromagnetic radiation from a plurality of DUTs 30 to a plurality of dispersive elements 260, which may disperse the electromagnetic radiation and provide the dispersed electromagnetic radiation to the plurality of optical transducers 244.

Illustrative, non-exclusive examples of dispersive elements 260 according to the present disclosure include prisms and/or diffraction gratings. Illustrative, non-exclusive examples of optical transducers 244 according to the present disclosure include a spectrometer 246 and/or a linear array spectrometer 246. The optical detection device of FIG. 10 may provide for simultaneous, parallel analysis of the electromagnetic radiation that may be emitted from the plurality of DUTs, while also maintaining the accuracy and/or resolution that may be obtained with the linear array spectrometer.

Figure 11:
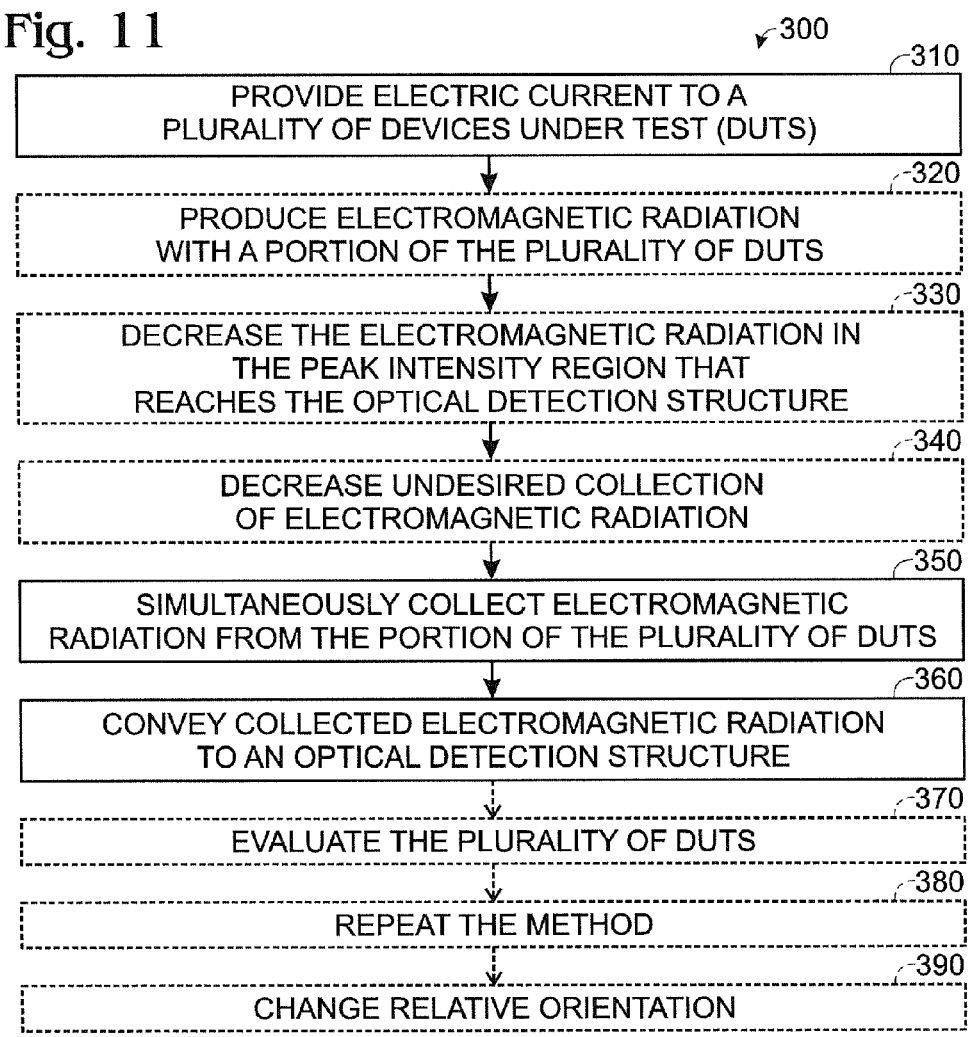
FIG. 11 is a flowchart depicting methods according to the present disclosure of simultaneously testing a plurality of devices under test.

FIG. 11 is a flowchart depicting methods 300 according to the present disclosure of simultaneously testing a plurality of DUTs. The methods include providing electric current to a plurality of DUTs at 310 and optionally may include producing electromagnetic radiation with a portion of the plurality of DUTs at 320, decreasing the electromagnetic radiation in the peak intensity region that reaches the optical detection structure at 330, and/or decreasing undesired collection of electromagnetic radiation at 340. The methods further include simultaneously collecting electromagnetic radiation from a portion of the plurality of DUTs at 350 and conveying the collected electromagnetic radiation to an optical detection structure at 360. The methods further may include optionally evaluating the plurality of DUTs at 370, repeating the method at 380, and/or changing the relative orientation of the optical probe assembly with respect to the substrate and/or the plurality of DUTs at 390.

Providing the electric current to the plurality of DUTs at 310 may include the use of any suitable power supply structure to form an electrical connection between the optical probe assembly and the plurality of DUTs and to provide the electric current thereto. As an illustrative, non-exclusive example, the providing may include providing the electric current from a plurality of electrical probes associated with the power supply structure to the plurality of DUTs.

As discussed in more detail herein, the electric current may include a DC electric current. In addition, the providing may include providing the DC electric current to the plurality of DUTs with a forward bias polarity, or voltage, and/or with a reverse bias polarity, or voltage. When the DC electric current is provided to the plurality of DUTs with the forward bias polarity, and when the plurality of DUTs includes a plurality of LEDs, the plurality of DUTs may emit the electromagnetic radiation. Conversely, when the DC electric current is provided to the plurality of DUTs with the reverse bias polarity, and when the plurality of DUTs includes the plurality of LEDs, the plurality of DUTs may not emit the electromagnetic radiation.

Producing the electromagnetic radiation with a portion of the plurality of DUTs at 320 may include receiving the electric current with the portion of the plurality of DUTs and producing the electromagnetic radiation therefrom. It is within the scope of the present disclosure that the portion of the plurality of DUTs may include the entire plurality of DUTs. However, it is also within the scope of the present disclosure that the portion of the plurality of DUTs may include fewer than the entire plurality of DUTs. As an illustrative, non-exclusive example, the portion of the plurality of DUTs may include a functional portion of the plurality of DUTs, wherein the functional portion of the plurality of DUTs includes a portion of the plurality of DUTs that emits the electromagnetic radiation when the electric current is supplied thereto.

Decreasing the electromagnetic radiation in the peak intensity region that reaches the optical detection structure may include the use of any suitable structure to decrease, block, and/or otherwise attenuate the magnitude, or intensity, of the electromagnetic radiation in the peak intensity region that reaches the optical detection structure. As an illustrative, non-exclusive example, and as discussed in more detail herein, this may include the use of an attenuating structure to decrease the magnitude of the electromagnetic radiation from the peak intensity region that reaches the optical detection structure.

Decreasing undesired collection of electromagnetic radiation at 340 may include the use of any suitable structure to decrease a magnitude of the electromagnetic radiation that is collected by the optical collection structure and/or by an optical collection device thereof that does not originate from a target, desired, and/or respective DUT that is associated with the optical collection structure and/or the optical collection device. As an illustrative, non-exclusive example, and as discussed in more detail herein, this may include the use of an optical baffle structure to decrease the undesired collection of electromagnetic radiation.

Simultaneously collecting the electromagnetic radiation from the portion of the plurality of DUTs at 350 may include the use of any suitable structure, illustrative, non-exclusive examples of which include an optical collection structure and/or an optical collection device thereof, to collect the electromagnetic radiation. As an illustrative, non-exclusive example, the optical collection structure may include a single optical collection device, and the simultaneously collecting may include simultaneously collecting the electromagnetic radiation from each DUT of the portion of the plurality of DUTs with the single optical collection device. As an illustrative, non-exclusive example, the single optical collection device may include a lens.

As another illustrative, non-exclusive example, the optical collection structure may include a plurality of optical collection devices, and the simultaneously collecting may include simultaneously collecting the electromagnetic radiation from the portion of the plurality of DUTs with the plurality of optical collection devices. Each of the plurality of optical collection devices may be configured to collect the electromagnetic radiation from any suitable number of DUTs, illustrative, non-exclusive examples of which include 1, at least 2, at least 3, at least 4, at least 5, at least 10, at least 25, at least 50, at least 100, at least 250, at least 500, at least 1,000, at least 2,500, at least 5,000, at least 10,000, at least 1%, at least 2%, at least 3%, at least 4%, at least 5%, at least 7.5%, or at least 10% of the plurality of DUTs.

Conveying the collected electromagnetic radiation to the optical detection structure at 360 may include the use of any suitable structure to convey, transmit, and/or otherwise direct the electromagnetic radiation from the plurality of DUTs and/or from the optical collection structure to the optical detection structure. As an illustrative, non-exclusive example, this may include the use of any suitable optical conduit, illustrative, non-exclusive examples of which are discussed in more detail herein, to convey the collected electromagnetic radiation.

Evaluating the plurality of DUTs at 370 may include the use of any suitable optical probe system and/or analysis system to analyze, categorize, and/or otherwise evaluate the performance of the plurality of DUTs. As illustrative, non-exclusive examples, the evaluating may include evaluating an intensity and/or a spectral distribution of the electromagnetic radiation that is produced by each of the plurality of DUTs.

Repeating the method at 380 may include repeating any suitable portion of the method to provide electric current to and simultaneously collect electromagnetic radiation from any suitable plurality of DUTs. As an illustrative, non-exclusive example, the plurality of DUTs may include a first plurality of DUTs, and the repeating may include repeating the method on a second plurality of DUTs, wherein the second plurality of DUTs is different from the first plurality of DUTs.

As discussed in more detail herein, and as indicated at 390 in FIG. 11, the repeating may include changing the relative orientation of at least a portion of the optical probe assembly with respect to the plurality of DUTs and/or the substrate that includes the plurality of DUTs. As an illustrative, non-exclusive example, this may include changing the relative orientation from a relative orientation in which the optical probe assembly is aligned with the first plurality of DUTs to a relative orientation in which the optical probe assembly is aligned with the second plurality of DUTs.

Additionally or alternatively, it is also within the scope of the present disclosure that the repeating may include providing the electric current to the second plurality of DUTs. As discussed in more detail herein, this may include providing the electric current to the second plurality of DUTS after changing the relative orientation of the optical probe assembly, and/or the power supply structure thereof, from an orientation that corresponds to the first plurality of DUTs to an orientation that corresponds to an orientation of the second plurality of DUTs. Alternatively, this may include providing the electric current to the second plurality of DUTs without changing the relative orientation of the optical probe assembly and/or power supply structure thereof with respect to the substrate, the first plurality of DUTs, and/or the second plurality of DUTs.

As discussed in more detail herein, the plurality of DUTs may be present on a substrate. When the plurality of DUTs are present on the substrate, it is within the scope of the present disclosure that methods 300, and/or at least the providing at 310, simultaneously collecting at 350, and conveying at 360 may be performed prior to singulation of the plurality of DUTs from the substrate.

In addition, and as also discussed in more detail herein, the substrate may include a power contact side and an emission side. The providing at 310 may include providing the electromagnetic radiation to the power contact side of the substrate, while the simultaneously collecting at 350 may include simultaneously collecting the electromagnetic radiation from the emission side of the substrate. As also discussed in more detail herein, it is within the scope of the present disclosure that the power supply side and the emission side may be on the same side of the substrate or on different, or opposed, sides of the substrate.

In the illustrative, non-exclusive examples presented herein, DUTs 30 have been illustrated as including two pads 32 that are configured to form an electrical connection with a power source, such as power supply structure 100. Similarly, power supply structure 100 has been illustrated as including two electrical probes 104 and/or probe tips 108 for each of the plurality of DUTs that may form an electrical connection therewith. However, it is within the scope of the present disclosure that DUTs 30 may include any suitable number of pads 32 and/or that power supply structure 100 may include any suitable number of respective electrical probes 104 and/or probe tips 108.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. An optical probe assembly that is configured to provide electric current to and receive electromagnetic radiation from a plurality of devices under test (DUTs), the optical probe assembly comprising:

a power supply structure that is configured to provide the electric current to the plurality of DUTs; and an optical collection structure that is configured to simultaneously collect the electromagnetic radiation from each of the plurality of DUTs and provide the electromagnetic radiation to an optical detection structure.

A2. The optical probe assembly of paragraph A1, wherein each of the plurality of DUTs is configured to receive the electric current from the optical probe assembly and to produce the electromagnetic radiation therefrom.

A3. The optical probe assembly of any of paragraphs A1-A2, wherein the plurality of DUTs is on a substrate, and optionally wherein the optical probe assembly is configured to provide the electric current to and simultaneously collect the electromagnetic radiation from the plurality of DUTs prior to singulation of the plurality of DUTs.

A4. The optical probe assembly of any of paragraphs A1-A3, wherein the optical probe assembly further includes at least one optical conduit that is configured to transmit the electromagnetic radiation from the optical collection structure to the optical detection structure.

A5. The optical probe assembly of any of paragraphs A1-A4, wherein the optical collection structure includes a plurality of optical collection devices, wherein the optical probe assembly includes a plurality of optical conduits, and further wherein each of the plurality of optical conduits is configured to transmit the electromagnetic radiation from a respective one of the plurality of optical collection devices to the optical detection structure.

A6. The optical probe assembly of any of paragraphs A1-A5, wherein the optical collection structure includes at least one optical conduit that is configured to transmit the electromagnetic radiation from a portion of the plurality of DUTs to the optical detection structure, optionally wherein the portion of the plurality of DUTs includes 1, at least 2, at least 3, at least 4, at least 5, at least 10, at least 25, at least 50, at least 100, at least 250, at least 500, at least 1000, at least 2500, at least 5000, or at least 10,000 of the plurality of DUTs, optionally wherein the portion of the plurality of DUTs includes at least 1%, at least 2%, at least 3%, at least 4%, at least 5%, at least 7.5%, at least 10%, at least 15%, at least 20%, at least 25%, at least 50%, at least 75%, 100%, 1-10%, 1-25%, 5-20%, or 5-50% of the plurality of DUTs, optionally wherein the optical collection structure includes at least 2, at least 3, at least 4, at least 5, at least 10, or at least 25 optical conduits, and further optionally wherein the optical collection structure includes one optical conduit for each of the plurality of DUTs.

A7. The optical probe assembly of any of paragraphs A4-A6, wherein the optical conduit includes at least one of a fiber optic cable, a lens, a mirror, an optical filter, a diffraction structure, a diffraction grating, and a prism.

A8. The optical probe assembly of any of paragraphs A1-A7, wherein the optical detection structure includes an optical transducer that is configured to receive the electromagnetic radiation from the plurality of DUTs and to produce an optical transducer electric output therefrom, wherein the optical transducer electric output includes one or more optical characteristic of each of the plurality of DUTs.

A9. The optical probe assembly of paragraph A8, wherein the optical transducer includes at least one of a spectrometer, a photodetector, an active pixel sensor, a charge-coupled device, a photodiode, a photoresistor, a photovoltaic cell, a photomultiplier, a phototube, a phototransistor, and a diffraction structure that is configured to provide the electromagnetic radiation to a linear array spectrometer.

A10. The optical probe assembly of any of paragraphs A1-A9, wherein the optical detection structure includes a plurality of optical transducers that is configured to receive the electromagnetic radiation from the plurality of DUTs and to produce a plurality of optical transducer electric outputs therefrom, wherein each of the plurality of optical transducer electric outputs includes one or more optical characteristic of a portion of the plurality of DUTs, optionally wherein the portion of the plurality of DUTs includes 1, at least 2, at least 3, at least 4, at least 5, at least 10, at least 25, at least 50, at least 100, at least 250, at least 500, at least 1000, at least 2500, at least 5000, or at least 10,000 of the plurality of DUTs, and further optionally wherein the portion of the plurality of DUTs includes at least 1%, at least 2%, at least 3%, at least 4%, at least 5%, at least 7.5%, at least 10%, at least 15%, at least 20%, at least 25%, at least 50%, 1-10%, 1-25%, 5-20%, or 5-50% of the plurality of DUTs.

A11. The optical probe assembly of paragraph A10, wherein the plurality of optical transducers includes at least one of a spectrometer, a photodetector, an active pixel sensor, a charge-coupled device, a photodiode, a photoresistor, a photovoltaic cell, a photomultiplier, a phototube, a phototransistor, and a diffraction structure that is configured to provide the electromagnetic radiation to a linear array spectrometer.

A12. The optical probe assembly of any of paragraphs A8-A11, wherein the one or more optical characteristic includes at least one of an intensity of the electromagnetic radiation produced by each of the plurality of DUTs and a spectral distribution of the electromagnetic radiation produced by each of the plurality of DUTs.

A13. The optical probe assembly of any of paragraphs A1-A12, wherein the optical collection structure includes at least one of an integrating sphere, a bell, a dome, a fiber optic cable, an optical waveguide, a cone, a mirror, and a lens.

A14. The optical probe assembly of any of paragraphs A1-A13, wherein the optical collection structure is configured to simultaneously collect at least 75%, at least 80%, at least 85%, at least 90%, at least 95%, at least 99%, or at least 99.9% of the electromagnetic radiation produced by each of the plurality of DUTs.

A15. The optical probe assembly of any of paragraphs A1-A14, wherein each of the plurality of DUTs includes an angular distribution of the electromagnetic radiation produced therefrom, wherein the angular distribution includes a peak intensity region, and further wherein the optical collection structure includes an attenuating structure that is configured to decrease the electromagnetic radiation in the peak intensity region that reaches the optical detection structure.

A16. The optical probe assembly of paragraph A15, wherein the attenuating structure includes at least one of an absorbing structure that is configured to absorb the electromagnetic radiation in the peak intensity region and a reflecting structure that is configured to reflect the electromagnetic radiation in the peak intensity region away from the optical detection structure.

A17. The optical probe assembly of any of paragraphs A15-A16, wherein the attenuating structure is configured to decrease an intensity of the electromagnetic radiation in the peak intensity region that reaches the optical detection structure by at least 50%, at least 60%, at least 70%, at least 80%, at least 90%, at least 95%, at least 99%, at least 99.9%, or 100%.

A18. The optical probe assembly of any of paragraphs A1-A17, wherein the power supply structure includes a plurality of electrical probes, and further wherein the plurality of electrical probes is configured to form an electric connection between each of the plurality of DUTs and the optical probe assembly.

A19. The optical probe assembly of paragraph A18, wherein the plurality of electrical probes includes a plurality of probe tips that is configured to form the electric connection with a plurality of contact pads on the plurality of DUTs.

A20. The optical probe assembly of any of paragraphs A18-A19, wherein the plurality of electrical probes is operatively attached to a power supply probe card.

A21. The optical probe assembly of paragraph A20, wherein the power supply probe card includes an optically transparent power supply probe card that provides for transmission of the electromagnetic radiation from the plurality of DUTs therethrough, and optionally wherein the optically transparent power supply probe card includes an optically transparent material.

A22. The optical probe assembly of any of paragraphs A20-A21, wherein the power supply probe card includes one or more optically transparent regions that provide for transmission of the electromagnetic radiation from the plurality of DUTs therethrough, and optionally wherein the one or more optically transparent regions include at least one of an optically transparent material and an aperture in the power supply probe card.

A23. The optical probe assembly of any of paragraphs A1-A22, wherein the optical probe assembly is in electrical communication with an electric current source that is configured to provide the electric current to the power supply structure, and optionally wherein the optical probe assembly includes the electric current source.

A24. The optical probe assembly of any of paragraphs A1-A23, wherein the electric current includes a DC electric current.

A25. The optical probe assembly of paragraph A24, wherein the optical probe assembly is configured to provide the DC electric current to the plurality of DUTs with a forward bias polarity, and further wherein, when the DC electric current is provided to the plurality of DUTs with the forward bias polarity, the plurality of DUTs are configured to produce the electromagnetic radiation.

A26. The optical probe assembly of paragraph A24, wherein the optical probe assembly is further configured to provide the DC electric current to the plurality of DUTs with a reverse bias polarity, and further wherein, when the DC electric current is provided to the plurality of DUTs with the reverse bias polarity, the plurality of DUTs are not configured to produce the electromagnetic radiation.

A27. The optical probe assembly of any of paragraphs A1-A26, wherein the optical collection structure includes a single optical collection device that is configured to collect the electromagnetic radiation from each of the plurality of DUTs.

A28. The optical probe assembly of any of paragraphs A1-A27, wherein the optical collection structure includes a plurality of optical collection devices.

A29. The optical probe assembly of paragraph A28, wherein each of the plurality of optical collection devices is respectively configured to collect the electromagnetic radiation from only one of the plurality of DUTs.

A30. The optical probe assembly of paragraph A28, wherein each of the plurality of optical collection devices is configured to simultaneously collect the electromagnetic radiation from at least 2 of the plurality of DUTs, optionally including at least 3, at least 4, at least 5, at least 10, at least 25, at least 50, at least 100, at least 250, at least 500, at least 1000, at least 2500, at least 5000, at least 10,000, 1-100, 1-1,000, 2-5, or 5-25 of the plurality of DUTs, and further optionally including at least 1%, at least 2%, at least 3%, at least 4%, at least 5%, at least 7.5%, or at least 10% of the plurality of DUTs.

A31. The optical probe assembly of any of paragraphs A28-A30, wherein the plurality of optical collection devices includes at least 2 optical collection devices, optionally including at least 3, at least 4, at least 5, at least 6, at least 7, at least 8, at least 9, at least 10, at least 15, at least 20, at least 25, at least 30, at least 40, at least 50, at least 75, or at least 100 optical collection devices.

A32. The optical probe assembly of any of paragraphs A28-A31, wherein the plurality of optical collection devices is operatively attached to an optical probe card.

A33. The optical probe assembly of paragraph A32, wherein the plurality of optical collection devices is configured to be detached from the optical probe card, and optionally wherein the plurality of optical collection devices is configured to be selectively detached from the optical probe card without damage to the plurality of optical collection devices or the optical probe card, and further optionally wherein the plurality of optical collection devices is configured to be detached from the optical probe card and replaced.

A34. The optical probe assembly of any of paragraphs A32-A33, wherein the optical probe card includes at least one recess in which the plurality of optical collection devices is present, further wherein each of the plurality of optical collection devices is present within a respective one of the plurality of recesses.

A35. The optical probe assembly of any of paragraphs A32-A34, wherein the optical probe assembly is configured to provide for the transmission of the electromagnetic radiation through a/the recess in the optical probe card.

A36. The optical probe assembly of any of any of paragraphs A32-A35, wherein the optical probe card includes at least one of an optically transparent optical probe card and a plurality of holes that provide for transmission of the electromagnetic radiation therethrough.

A37. The optical probe assembly of any of paragraphs A32-A36, wherein the optical detection structure is operatively attached to the optical probe card.

A38. The optical probe assembly of any of paragraphs A32-A37, when dependent from any of paragraphs A20-A31, wherein the optical probe card is separate from the power supply probe card.

A39. The optical probe assembly of any of paragraphs A32-A37, when dependent from any of paragraphs A20-A31, wherein the optical probe card includes the power supply probe card.

A40. The optical probe assembly of any of paragraphs A28-A39, wherein the optical probe assembly further includes an optical baffle structure that is configured to decrease a transmission of electromagnetic radiation from a first device under test (DUT) of the plurality of DUTs that is associated with a first optical collection device to a second optical collection device that is associated with a second DUT of the plurality of DUTs.

A41. The optical probe assembly of any of paragraphs A1-A17, wherein the power supply structure includes a plurality of electrical probes that is configured to form an electrical connection between each of the plurality of DUTs and the optical probe assembly, wherein the optical collection structure includes a plurality of optical collection devices, and further wherein the plurality of electrical probes and the plurality of optical collection devices are operatively attached to a probe card.

A42. The optical probe assembly of any of paragraphs A1-A17, wherein the power supply structure includes a plurality of electrical probes that is configured to form an electrical connection between each of the plurality of DUTs and the optical probe assembly, wherein the optical collection structure includes a plurality of optical collection devices, wherein the plurality of electrical probes is operatively attached to the plurality of optical collection devices, and further wherein the plurality of optical collection devices is operatively attached to a probe card.

A43. The optical probe assembly of any of paragraphs A1-A17, wherein the power supply structure includes a plurality of electrical probes that is operatively attached to a power supply probe card and configured to form an electrical connection between each of the plurality of DUTs and the optical probe assembly, and further wherein the optical collection structure includes a plurality of optical collection devices operatively attached to an optical probe card.

A44. The optical probe assembly of paragraph A43, wherein the plurality of DUTs are formed on a planar substrate, wherein the power supply probe card is configured to be in electrical communication with a power contact side of the planar substrate when providing the electric current to the plurality of DUTs, and further wherein the optical probe card is configured to be in optical communication with an emission side of the planar substrate when receiving the electromagnetic radiation from the plurality of DUTs.

A45. The optical probe assembly of paragraph A44, wherein the power contact side and the emission side are on opposed sides of the planar substrate.

A46. The optical probe assembly of paragraph A44, wherein the power contact side and the emission side are on a test side of the planar substrate.

A47. The optical probe assembly of paragraph A46, wherein the power supply probe card is located between the optical probe card and the plurality of DUTs.

A48. The optical probe assembly of paragraph A47, wherein the power supply probe card includes a plurality of openings that is configured to provide for transmission of the electromagnetic radiation from the plurality of DUTs to the plurality of optical collection devices.

A49. The optical probe assembly of paragraph A47, wherein the power supply probe card includes an optically transparent probe card that is configured to provide for transmission of the electromagnetic radiation from the plurality of DUTs to the plurality of optical collection devices.

A50. The optical probe assembly of paragraph A47, wherein the power supply probe card includes a plurality of optically transparent regions that is configured to provide for transmission of the electromagnetic radiation from the plurality of DUTs to the plurality of optical collection devices.

A51. The optical probe assembly of any of paragraphs A49-A50, wherein the plurality of electrical probes include a plurality of optically transparent electrical probes that is configured to provide for transmission of the electromagnetic radiation from the plurality of DUTs to the plurality of optical collection devices, and optionally wherein the plurality of optically transparent electrical probes includes at least one of a graphene electrical probe and an indium tin oxide electrical probe.

A52. The optical probe assembly of any of paragraphs A1-A17, wherein the optical collection structure includes a lens that is configured to collect the electromagnetic radiation from the plurality of DUTs and to focus the collected electromagnetic radiation on the optical detection structure.

A53. The optical probe assembly of paragraph A52, wherein the optical detection structure includes a 2-dimensional optical sensor array.

A54. An optical probe system that is configured to simultaneously test the operation of a plurality of DUTs, the optical probe system comprising:
  the optical probe assembly of any of paragraphs A1-A53;
  a chuck that is configured to hold the plurality of DUTs;
  an optical detection structure; and
  an analysis system that is configured to receive a data signal from the optical detection structure and to calculate an/the optical characteristic of each of the plurality of DUTs therefrom, and optionally wherein the optical characteristic includes at least one of an intensity and a spectral distribution of each of the plurality of DUTs.

B1. A method of simultaneously testing electromagnetic emissions from a plurality of devices under test (DUTs), the method comprising:
  providing an electric current to each of the plurality of DUTs with a power supply structure;
  simultaneously collecting electromagnetic radiation from at least a portion of the plurality of DUTs with an optical collection structure, wherein the portion of the plurality of DUTs includes at least 2 DUTs, and optionally wherein the portion of the plurality of DUTs includes at least 3, at least 4, at least 5, at least 6, at least 7, at least 8, at least 9, at least 10, at least 15, at least 20, at least 25, at least 50, at least 75, or at least 100 DUTs; and
  conveying the electromagnetic radiation to an optical detection structure.

B2. The method of paragraph B1, wherein the method further includes producing the electromagnetic radiation with the plurality of DUTs.

B3. The method of any of paragraphs B1-B2, wherein the plurality of DUTs is on a substrate, wherein the plurality of DUTs is configured to be singulated into a plurality of individual DUTs, and further wherein the providing, the simultaneously collecting, and the conveying are performed prior to singulation of the plurality of DUTs.

B4. The method of paragraph B3, wherein the substrate includes a planar substrate including two sides, wherein the providing includes providing the electric current to a power contact side of the planar substrate, and further wherein the collecting includes collecting the electromagnetic radiation from an emission side of the planar substrate.

B5. The method of paragraph B4, wherein the power contact side and the emission side are on opposed sides of the planar substrate.

B6. The method of paragraph B5, wherein the power supply structure includes a plurality of electrical probes operatively attached to a power supply probe card and configured to form an electrical connection between each of the plurality of DUTs and the power supply probe card, wherein the optical collection structure includes a plurality of optical collection devices operatively attached to an optical probe card, wherein the providing includes providing the electric current from the power supply probe card to the power contact side of the substrate, and further wherein the simultaneously collecting includes simultaneously collecting the electromagnetic radiation from the emission side of the substrate with the optical probe card.

B7. The method of paragraph B4, wherein the power contact side and the emission side are on a test side of the planar substrate.

B8. The method of paragraph B7, wherein the power supply structure includes a plurality of electrical probes, wherein the optical collection structure includes a plurality of optical collection devices, wherein the plurality of electrical probes and the plurality of optical collection devices are operatively attached to a probe card, wherein the providing includes providing the electric current from the probe card to the test side of the substrate, and further wherein the simultaneously collecting includes simultaneously collecting the electromagnetic radiation from the test side of the substrate with the probe card.

B9. The method of paragraph B7, wherein the power supply structure includes a plurality of electrical probes, wherein the optical collection structure includes a plurality of optical collection devices, wherein the plurality of electrical probes is operatively attached to the plurality of optical collection devices, wherein the plurality of optical collection devices is operatively attached to a probe card, wherein the providing includes providing the electric current from the probe card to the test side of the substrate, and further wherein the simultaneously collecting includes simultaneously collecting the electromagnetic radiation from the test side of the substrate with the probe card.

B10. The method of paragraph B7, wherein the power supply structure includes a plurality of electrical probes operatively attached to a power supply probe card, wherein the optical collection structure includes a plurality of optical collection devices operatively attached to an optical probe card, wherein the providing includes providing the electric current from the power supply probe card to the test side of the substrate, and further wherein the simultaneously collecting includes simultaneously collecting the electromagnetic radiation from the test side of the substrate with the optical probe card.

B11. The method of paragraph B10, wherein the power supply probe card is located between the optical probe card and the plurality of DUTs, and further wherein the simultaneously collecting includes transmitting the electromagnetic radiation through the power supply probe card and from the plurality of DUTs to the plurality of optical collection devices.

B12. The method of paragraph B11, wherein the transmitting includes transmitting the electromagnetic radiation through an opening present within the power supply probe card.

B13. The method of paragraph B11, wherein the transmitting includes transmitting the electromagnetic radiation through an optically transparent portion of the power supply probe card.

B14. The method of paragraph B7, wherein the optical collection structure includes a lens, and further wherein the method includes collecting the electromagnetic radiation with the lens and the conveying includes focusing the electromagnetic radiation on the optical detection structure with the lens.

B15. The method of any of paragraphs B1-B14, wherein the portion of the plurality of DUTs includes a functional portion of the plurality of DUTs, and optionally wherein the portion of the plurality of DUTs includes all of the plurality of DUTs.

B16. The method of any of paragraphs B1-B15, wherein the method further includes evaluating at least one of an intensity and a spectral distribution of each of the plurality of DUTs.

B17. The method of any of paragraphs B1-B16, wherein each of the plurality of DUTs includes an angular distribution of the electromagnetic radiation produced therefrom, wherein the angular distribution includes a peak intensity region, and further wherein the method includes decreasing a fraction of the electromagnetic radiation in the peak intensity region that reaches the optical detection structure.

B18. The method of any of paragraphs B1-B17, wherein the power supply structure includes a/the plurality of electrical probes, and further wherein the providing includes providing the electric current from the power supply structure to the plurality of DUTs with the plurality of electrical probes.

B19. The method of any of paragraphs B1-B18, wherein the electric current includes a DC electric current, and further wherein the providing includes providing the DC electric current to each of the plurality of DUTs.

B20. The method of paragraph B19, wherein the providing includes providing the DC electric current to each of the plurality of DUTs with a forward bias polarity, wherein the portion of the plurality of DUTs is configured to produce the electromagnetic radiation when the DC electric current includes the forward bias polarity.

B21. The method of paragraph B19, wherein the providing further includes providing the DC electric current to each of the plurality of DUTs with a reverse bias polarity, wherein the portion of the plurality of DUTs is not configured to produce the electromagnetic radiation when the DC electric current includes the reverse bias polarity.

B22. The method of any of paragraphs B1-B21, wherein the optical collection structure includes a single optical collection device that is configured to collect the electromagnetic radiation from each of the plurality of DUTs, and further wherein the simultaneously collecting includes simultaneously collecting the electromagnetic radiation from each of the plurality of DUTs with the single optical collection device.

B23. The method of any of paragraphs B1-B22, wherein the optical collection structure includes a plurality of optical collection devices, wherein each of the plurality of optical collection devices is respectively configured to collect the electromagnetic radiation from one or more of the plurality of DUTs, wherein the simultaneously collecting includes simultaneously collecting the electromagnetic radiation from the plurality of DUTs with the plurality of optical collection devices, optionally wherein each of the plurality of optical collection devices is configured to collect the electromagnetic radiation from at least 2, at least 3, at least 4, at least 5, at least 10, at least 25, at least 50, at least 100, at least 250, at least 500, at least 1000, at least 2500, at least 5000, at least 10,000, 1-100, 1-1,000, 2-5, or 5-25 of the plurality of DUTs, and further optionally including at least 1%, at least 2%, at least 3%, at least 4%, at least 5%, at least 7.5%, or at least 10% of the plurality of DUTs.

B24. The method of paragraph B23, wherein the method further includes decreasing a transmission of electromagnetic radiation from a first device under test associated with a first optical collection device to a second optical collection device associated with a second device under test.

B25. The method of any of paragraphs B1-B24, wherein the plurality of DUTs is a first plurality of DUTs, and further wherein the method includes repeating the method to simultaneously test a second plurality of DUTs, wherein the second plurality of DUTs is on a/the substrate, and further wherein the second plurality of DUTs is different from the first plurality of DUTs.

B26. The method of paragraph B25, wherein the repeating includes changing a relative orientation of the optical collection structure with respect to the substrate.

B27. The method of paragraph B26, wherein the changing includes changing from a relative orientation in which the optical collection structure is aligned with the first plurality of DUTs to a relative orientation in which the optical collection structure is aligned with the second plurality of DUTs.

B28. The method of any of paragraphs B25-B27, wherein the repeating includes providing the electric current to the second plurality of DUTs.

B29. The method of paragraph B28, wherein providing the electric current to the second plurality of DUTs includes changing a relative orientation of the power supply structure from a relative orientation in which the power supply structure is aligned with the first plurality of DUTs to a relative orientation in which the power supply structure is aligned with the second plurality of DUTs.

B30. The method of any of paragraphs B28-B29 when dependent from paragraph B25, wherein the repeating includes providing the electric current to the second plurality of DUTs without changing a relative orientation of the optical collection structure with respect to the substrate.

C1. The optical probe assembly of any of paragraphs A1-A53, the optical probe system of paragraph A54, or the method of any of paragraphs B1-B30, wherein the plurality of DUTs includes at least one of a plurality of optoelectronic devices and a plurality of light-emitting diodes.

C2. The optical probe assembly of any of paragraphs A1-A53, the optical probe system of paragraph A54, or the method of any of paragraphs B1-B30, wherein the electromagnetic radiation includes at least one of infrared electromagnetic radiation, visible electromagnetic radiation, and ultraviolet electromagnetic radiation.

C3. The optical probe assembly of any of paragraphs A1-A53, the optical probe system of paragraph A54, or the method of any of paragraphs B1-B30, wherein a wavelength of the electromagnetic radiation is in the range of $10^{-10}$ and $10^{-2}$ meters (m), optionally including wavelengths in the range of $10^{-8}$ and $10^{-7}$ meters, in the range of $10^{-7}$ and $10^{-6}$ meters, in the range of $10^{-6}$ and $10^{-3}$ meters, or in the range of 380-750 nanometers.

C4. The optical probe assembly of any of paragraphs A1-A53, the optical probe system of paragraph A54, or the method of any of paragraphs B1-B30, wherein the plurality of DUTs is on a substrate.

C5. The optical probe assembly of paragraph C4, the optical probe system of paragraph C4, or the method of paragraph C4, wherein the substrate includes at least one of a semiconductor wafer, silicon, gallium arsenide, sapphire, silicon carbide, zinc selenide, a glass, a plastic, and a polymer.

C6. The optical probe assembly of any of paragraphs C4-C5, the optical probe system of any of paragraphs C4-C5, or the method of any of paragraphs C4-C5, wherein the plurality of DUTs includes all of the DUTs present on the substrate.

C7. The optical probe assembly of any of paragraphs C4-C5, the optical probe system of any of paragraphs C4-C5, or the method of any of paragraphs C4-C5, wherein the plurality of DUTs includes a portion of the DUTs present on the substrate, and optionally wherein the portion of the DUTs present on the substrate includes at least 1%, at least 2%, at least 3%, at least 4%, at least 5%, at least 10%, at least 15%, at least 20%, at least 25%, at least 50%, 1-10%, 5-20%, or 1-25% of the DUTs present on the substrate.

C8. The optical probe assembly of paragraph C7, the optical probe system of paragraph C7, or the method of paragraph C7, wherein the plurality of DUTs are arranged on the substrate in a two-dimensional grid including a first dimension and a second dimension, and further wherein a first device under test (DUT) of the plurality of DUTs is spaced apart from a second DUT of the plurality of DUTs by at least one intermediate DUT in at least one, and optionally both, the first dimension and the second dimension, and optionally by at least 2, at least 3, at least 4, at least 5, at least 10, at least 15, at least 20, at least 25, at least 50, at least 75, or at least 100 DUTs in at least one, and optionally both, the first dimension and the second dimension.

C9. The optical probe assembly of any of paragraphs C7-C8, the optical probe system of any of paragraphs C7-C8, or the method of any of paragraphs C7-C8, wherein the DUTs are arranged in a/the two-dimensional grid on the substrate, and further wherein a/the first device under test (DUT) of the plurality of DUTs is spaced apart from a/the second DUT of the plurality of DUTs by at least on millimeter (mm) in at least one, and optionally both, dimensions, and optionally by at least 2 mm, at least 3 mm, at least 4 mm, at least 5 mm, at least 10 mm, at least 15 mm, at least 20 mm, at least 25 mm, at least 30 mm, at least 35 mm, at least 40 mm, at least 45 mm, or at least 50 mm in at least one, and optionally both, dimensions.

C10. The optical probe assembly of any of paragraphs C4-C9, the optical probe system of any of paragraphs C4-C9, or the method of any of paragraphs C4-C9, wherein the substrate includes at least 1,000, at least 5,000, at least 10,000, at least 20,000, at least 30,000, at least 40,000, at least 50,000, at least 60,000, at least 70,000, at least 80,000, at least 90,000, or at least 100,000 DUTs.

D1. The use of any of the optical probe assemblies of any of paragraphs A1-A53 or C1-C10 or the optical probe system of any of paragraphs A54 or C1-C10 with any of the methods of any of paragraphs B1-B30 or C1-C10.

D2. The use of any of the methods of any of paragraphs B1-B30 or C1-C10 with any of the optical probe assemblies of any of paragraphs A1-A53 or C1-C10 or the optical probe system of any of paragraphs A54 or C1-C10.

D3. The use of any of the optical probe assemblies of any of paragraphs A1-A53 or C1-C10, the optical probe system of any of paragraphs A54 or C1-C10, or any of the methods of any of paragraphs B1-B30 or C1-C10 to simultaneously test a plurality of optoelectronic devices.

D4. The use of an optical probe assembly to simultaneously test the operation of a plurality of optoelectronic devices that are present on a substrate.

D5. The use of an optical probe assembly to provide power to and simultaneously collect electromagnetic radiation from a plurality of optoelectronic devices that are present on a substrate.

INDUSTRIAL APPLICABILITY

The systems and methods disclosed herein are applicable to the electronics industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. An optical probe assembly that is configured to provide electric current to and receive electromagnetic radiation from a plurality of devices under test (DUTs), wherein the plurality of DUTs is on a substrate, the optical probe assembly comprising:
   a power supply structure that is configured to simultaneously provide the electric current to the plurality of DUTs;
   an optical collection structure that is configured to simultaneously collect the electromagnetic radiation from each of the plurality of DUTs and provide the electromagnetic radiation to an optical detection structure, wherein the optical collection structure includes a first optical collection device associated with a first device under test (DUT) of the plurality of DUTs, and a second optical collection device associated with a second DUT of the plurality of DUTs; and
   an optical baffle structure that is configured to decrease a transmission of electromagnetic radiation from the first DUT to the second optical collection device.

2. The optical probe assembly of claim 1, wherein the optical detection structure includes a 2-dimensional optical sensor array.

3. The optical probe assembly of claim 1, wherein the power supply structure includes a plurality of electrical probes that is configured to form an electrical connection between each of the plurality of DUTs and the optical probe assembly, wherein the optical collection structure includes a plurality of optical collection devices, and further wherein the plurality of electrical probes and the plurality of optical collection devices are operatively attached to a probe card.

4. The optical probe assembly of claim 1, wherein the power supply structure includes a plurality of electrical probes that is configured to form an electrical connection between each of the plurality of DUTs and the optical probe assembly, wherein the optical collection structure includes a plurality of optical collection devices, wherein the plurality of electrical probes is operatively attached to the plurality of optical collection devices, and further wherein the plurality of optical collection devices is operatively attached to a probe card.

5. The optical probe assembly of claim 1, wherein the power supply structure includes a plurality of electrical probes that is operatively attached to a power supply probe card and configured to form an electrical connection between each of the plurality of DUTs and the optical probe assembly, and further wherein the optical collection structure includes a plurality of optical collection devices that is operatively attached to an optical probe card.

6. The optical probe assembly of claim 5, wherein the plurality of DUTs are formed on a planar substrate that includes two sides, wherein the power supply probe card is configured to be in electrical communication with a power contact side of the planar substrate when providing the electric current to the plurality of DUTs, and further wherein the optical probe card is configured to be in optical communication with an emission side of the planar substrate when receiving the electromagnetic radiation from the plurality of DUTs.

7. The optical probe assembly of claim 6, wherein the power contact side and the emission side are on opposed sides of the planar substrate.

8. The optical probe assembly of claim 6, wherein the power contact side and the emission side are on a test side of the planar substrate.

9. The optical probe assembly of claim 8, wherein the power supply probe card is located between the optical probe card and the plurality of DUTs.

10. The optical probe assembly of claim 1, wherein the plurality of DUTs is arranged on the substrate in a two-dimensional grid including a first dimension and a second dimension, and further wherein a first device under test (DUT) of the plurality of DUTs is spaced apart from a second DUT of the plurality of DUTs by at least one intermediate DUT in both the first dimension and the second dimension.

11. The optical probe assembly of claim 1, wherein each of the plurality of DUTs includes an angular distribution of the electromagnetic radiation produced therefrom, wherein the angular distribution includes a peak intensity region, and further wherein the optical collection structure includes an attenuating structure that is configured to decrease the electromagnetic radiation in the peak intensity region that reaches the optical detection structure.

12. An optical probe system that is configured to simultaneously test the operation of a plurality of DUTs, the optical probe system comprising:
   the optical probe assembly of claim 1;
   a chuck that is configured to hold the plurality of DUTs;
   the optical detection structure; and
   an analysis system that is configured to receive a data signal from the optical detection structure and to calculate an optical characteristic of each of the plurality of DUTs therefrom.

13. The optical probe assembly of claim 1, wherein the optical collection structure includes a plurality of optical conduits, and further wherein each of the plurality of optical conduits is configured to transmit the electromagnetic radiation from a respective one of the plurality of DUTs to the optical detection structure.

14. The optical probe assembly of claim 13, wherein the plurality of optical conduits includes a plurality of fiber optic cables.

15. The optical probe assembly of claim 13, wherein the optical collection structure further includes a plurality of optical collection devices that is configured to collect the electromagnetic radiation and to provide the electromagnetic radiation to the plurality of optical conduits.

16. The optical probe assembly of claim 15, wherein each of the plurality of optical collection devices is configured to collect the electromagnetic radiation from only one of the plurality of DUTs.

17. The optical probe assembly of claim 1, wherein the optical detection structure includes a plurality of optical transducers that is configured to receive the electromagnetic radiation from the plurality of DUTs and to produce a plurality of optical transducer electric outputs therefrom, wherein each of the plurality of optical transducer electric outputs includes one or more optical characteristic of a portion of the plurality of DUTs.

18. The optical probe assembly of claim 1, wherein the plurality of DUTs includes at least one of a plurality of optoelectronic devices and a plurality of light-emitting diodes.

19. The optical probe assembly of claim 1, wherein the optical detection structure includes an optical transducer that is configured receive the electromagnetic radiation from the plurality of DUTs and to produce an optical transducer electric output therefrom, wherein the optical transducer electric output includes one or more optical characteristic of each of the plurality of DUTs, and further wherein the optical transducer includes at least one of a spectrometer, a photodetector, an active pixel sensor, a charge-coupled device, a photodiode, a photoresistor, a photovoltaic cell, a photomultiplier, a phototube, a phototransistor, and a diffraction structure that is configured to provide the electromagnetic radiation to a linear array spectrometer.

20. A method of simultaneously testing electromagnetic emissions from a plurality of devices under test (DUTs), wherein the plurality of DUTs is present on a substrate, the method comprising:

simultaneously providing an electric current to each of the plurality of DUTs with a power supply structure;

simultaneously collecting electromagnetic radiation from at least a portion of the plurality of DUTs with an optical collection structure, wherein the portion of the plurality of DUTs includes at least 2 DUTs; and conveying the electromagnetic radiation to an optical detection structure, wherein the optical collection structure includes a plurality of optical collection devices which includes a first optical collection device and a second optical collection device, wherein each of the plurality of optical collection devices is configured to collect the electromagnetic radiation from a respective one of the plurality of DUTs, and wherein the conveying includes decreasing a transmission of electromagnetic radiation from a first DUT associated with the first optical collection device to the second optical collection device associated with a second DUT.

21. The method of claim 20, wherein each of the plurality of DUTs includes an angular distribution of the electromagnetic radiation produced therefrom, wherein the angular distribution includes a peak intensity region, and further wherein the method includes decreasing the electromagnetic radiation in the peak intensity region that reaches the optical detection structure.

22. The method of claim 20, wherein the plurality of DUTs is arranged on the substrate in a two-dimensional grid including a first dimension and a second dimension, wherein a first device under test (DUT) of the plurality of DUTs is spaced apart from a second DUT of the plurality of DUTs by at least one intermediate DUT in both the first dimension and the second dimension, and further wherein the providing does not include providing the electric current to the at least one intermediate DUT.

23. The method of claim 20, wherein the plurality of DUTs is configured to be singulated into a plurality of individual DUTs, and further wherein the simultaneously providing, the simultaneously collecting, and the conveying are performed prior to singulation of the plurality of DUTs.

24. The method of claim 20, wherein the optical collection structure includes a lens, and further wherein the method includes collecting the electromagnetic radiation with the lens and the conveying includes focusing the electromagnetic radiation on the optical detection structure with the lens.

25. The method of claim 20, wherein the method further includes evaluating at least one of an intensity and a spectral distribution of each of the plurality of DUTs.

26. The method of claim 20, wherein the plurality of DUTs is a first plurality of DUTs, and further wherein the method includes repeating the method to simultaneously test a second plurality of DUTs, wherein the second plurality of DUTs is on the substrate, and further wherein the second plurality of DUTs is different from the first plurality of DUTs.

27. The method of claim 20, wherein the plurality of DUTs includes at least one of a plurality of optoelectronic devices and a plurality of light-emitting diodes.

\* \* \* \* \*